(12) United States Patent
Ding

(10) Patent No.: US 7,436,880 B2
(45) Date of Patent: Oct. 14, 2008

(54) ADAPTIVE FILTERING USING FAST AFFINE PROJECTION ADAPTATION

(75) Inventor: Heping Ding, Ottawa (CA)

(73) Assignee: National Research Council of Canada, Ottawa, Ontario (CA)

( * ) Notice: Subject to any disclaimer, the term of this patent is extended or adjusted under 35 U.S.C. 154(b) by 859 days.

(21) Appl. No.: 10/919,267

(22) Filed: Aug. 17, 2004

(65) Prior Publication Data

US 2006/0039458 A1    Feb. 23, 2006

(51) Int. Cl.
*H03K 5/159* (2006.01)
(52) U.S. Cl. .................. 375/232; 375/229
(58) Field of Classification Search .......... 375/232, 375/229; 379/406.06, 406.08; 381/66, 71.11; 455/67.15; 708/301, 322, 426
See application file for complete search history.

(56) References Cited

U.S. PATENT DOCUMENTS

| | | | |
|---|---|---|---|
| 5,428,562 A | 6/1995 | Gay | |
| 6,137,881 A | 10/2000 | Oh et al. | |
| 6,754,340 B1 * | 6/2004 | Ding | 379/406.08 |
| 6,788,785 B1 * | 9/2004 | Ding | 379/406.08 |

FOREIGN PATENT DOCUMENTS

WO    WO 00/38319    11/1999

OTHER PUBLICATIONS

Gay et al., "The Fast Affine Projection Algorithm", *Proceedings of the International Conference on Acoustics, Speech and Signal Processing*, May 1995, pp. 3023-3026.
Tanaka et al., "Fast Projection Algorithm and Its Step Size Control", *Proceedings of the International Conference on Acoustics, Speech and Signal Processing*, May 1995, pp. 945-948.
Ding, "A Stable Fast Affine Projection Adaptation Algorithm Suitable for Low-Cost Processors", *Proceedings of the International Conference on Acoustics, Speech and Signal Processing*, Jun. 2000, pp. I-360-I-363.
Oh et al., "A Fast Affine Projection Algorithm for An Acoustic Echo Cancellation Using a Fixed-Point DSP Processor", *Proceedings of the International Conference on Acoustics, Speech and Signal Processing*, vol. 5, 1997, pp. 4121-4124.
Albu et al., "Analysis of the LNS Implementation of the Fast Affine Projection Algorithms", *Proceedings of the ISSC 2002*, Jun. 2002, pp. 251-255.
Albu et al. "Fast Affine Projections Algorithm using the Successive Over-Relaxation Method", *Proceedings of the Benelux IT conference*, May 2002, pp. 147-154.
Albu et al., "The Gauss-Seidel Fast Affine Projection Algorithm", *IEEE Workshop on Signal Processing Systems (SIPS 2002)*, Oct. 2002, pp. 109-114.

(Continued)

*Primary Examiner*—Khai Tran
(74) *Attorney, Agent, or Firm*—Anne Kinsman; Borden Ladner Gervais LLP

(57) ABSTRACT

A method of adaptive filtering using fast affine projection (FAP) that allows for direct solution of the projected error vector from the autocorrelation matrix using a backward and forward recursion technique or $LDL^T$ factorization of the autocorrelation matrix followed by forward substitution, scaling and backward substitution. The method results in less computational complexity in the implementation, while still having good stability and fast convergence.

20 Claims, 3 Drawing Sheets

OTHER PUBLICATIONS

Ding, "Performance of Two Novel Fast Affine Projection Adaptation Algorithms", EEE International Symposium on Circuits and Systems, vol. 6, May 23-26, 2005, pp. 2279-2282.

Ding, "A Stable Fast Affine Projection Adaptation Algorithm Suitable for Low-Cost Processors", IEEE International Conferene on Acoustics, Speech, and Signal Processing, vol. 1, pp. 360-363, Jun. 5-9, 2000.

Liu et al., "On the Use of A Modified Fast Affine Projection Algorithm in Subbands for Acoustic Echo Cancellation", Proceedings IEEE Digital Signal Processing Workshop, Loen, Norway, Sep. 1-4, 1996, pp. 354-357.

Oh et al., "A Fast Affine Projection Algorithm for An Acoustic Echo Canceller Using a Fixed-Point DSP Processor", IEEE International Conference on Acoustics, Speech, and Signal Processing, vol. 5, Apr. 21-24, 1997, pp. 4121-4124, ISBN: 0-8186-7919-0.

* cited by examiner

ADAPTIVE FILTERING USING FAST AFFINE PROJECTION ADAPTATION

FIELD OF THE INVENTION

The present invention relates generally to adaptive filtering. More particularly, the present invention relates to a fast affine projection method for adaptive filtering.

BACKGROUND OF THE INVENTION

Adaptive filtering is a digital signal processing (DSP) technique widely used in technical areas such as echo cancellation, noise cancellation, channel equalization, and system identification, and in telecom products, such as network echo cancellers, acoustic echo cancellers for full-duplex hands-free telephones and audio conferencing systems, active noise control, data communications systems, hearing aids, etc.

An adaptive filter can be characterized by its topology and its adatation algorithm or method. The choice of the adaptation algorithm in a specific adaptive filtering system directly affects the performance of the system.

Simple and stable, the normalized least mean square (NLMS) adaptation algorithm is now most widely used as the work horse in the industry. While used with a certain degree of success, the NLMS intrinsically converges slowly with colored training signals, like speech, which are most frequently encountered in telecommunications.

Thus, the search for adaptation algorithms that converge quickly and remain robust, stable, and simple is a very active research area. Of those that have been proposed, the recursive least squares (RLS) adaptation algorithm (see e.g. Simon Haykin, *Adaptive Filter Theory*, Fourth Edition, Prentice Hall, September 2001) converges most quickly, but is in most cases too complicated to be implemented on a commercial low-cost digital signal processor (DSP) and suffers from numerical problems.

In 1995, a very promising adaptation algorithm, the fast affine projection (FAP), was proposed (see e.g. Gay et al. (Acoustic Research Department, AT&T Bell Laboratories), "The Fast Affine Projection Algorithm", *Proceedings of the International Conference on Acoustics, Speech, and Signal Processing*, pp. 3023-3026, May 1995; and Tanaka et al. (NTT Human Interface Laboratories), "Fast Projection Algorithm and Its Step Size Control", *Proceedings of the International Conference on Acoustics, Speech, and Signal Processing*, pp. 945-948, May 1995). FAP is a simplified version of the more complicated affine projection algorithm (APA), and offers a user-selectable trade-off between the RLS and the NLMS algorithms. With colored training signals such as speech, the FAP converges almost as quickly as the RLS and can be only marginally more complex than the NLMS.

However, the originally proposed FAP algorithm has an intrinsic numerical issue—it collapses within a short period of time, even with floating-point calculations. As discussed by the present inventor in "A Stable Fast Affine Projection Adaptation Algorithm Suitable for Low-Cost Processors," *Proceedings of the International Conference on Acoustics, Speech, and Signal Processing*, pp. I-360-I-363, June 2000, this results from the accumulation of finite precision numerical errors in a linear system solving process associated with the FAP.

Thus, a key element in a FAP algorithm is the method used to solve the linear system; the choice of which determines the stability and robustness of the whole FAP algorithm. Many researchers in the academic world have been looking for stable, robust, yet simple approaches ever since the FAP algorithm was proposed. However, no completely satisfactory solutions have been found so far. The proposed approaches are either impractical to implement, give approximate solutions, are too complicated, or are not generally applicable.

Therefore, there is a need for improved adaptive filtering methods that are stable and simple, while providing fast convergence and reliable results.

SUMMARY OF THE INVENTION

It is an object of the present invention to obviate or mitigate at least one disadvantage of previous adaptive filtering techniques using fast affine projection.

In a first embodiment, the present invention provides a method of adaptive filtering using a fast affine projection adaptive filter. The method comprises steps of: initializing adaptive filter coefficients of the filter; updating the adaptive filter coefficients; and repeating the updating step as desired. The updating is accomplished by setting a normalized step size; determining autocorrelation matrix coefficients of an autocorrelation matrix $\underline{\underline{R}}_N$ from a reference input signal; directly determining a projected error vector $\underline{e}_N(n+1)$ by solving an N-th order positive-definite system of linear equations $\underline{\underline{R}}_N \underline{\epsilon}(n+1) = \underline{e}_N(n+1)$ using a backward recursion, followed by a forward recursion, on a known projected error vector $\underline{\epsilon}_N(n)$, where $\underline{e}_N(n+1)$ is a pre-fixed, one position down shifted version of the current output signal vector $\underline{e}_N(n)$ scaled in accordance with the normalized step size; and updating the adaptive filter coefficients in accordance with coefficients of the projected error vector.

In a further embodiment, the updating is accomplished by determining autocorrelation matrix coefficients of an autocorrelation matrix $\underline{\underline{R}}_N$ from a reference input signal; directly determining a projected error vector $\underline{\epsilon}_N(n)$ by solving an N-th order positive-definite system of linear equations $\underline{\underline{R}}_N \underline{\epsilon}(n) = \underline{e}_N(n)$ using an $LDL^T$ factorization of the autocorrelation matrix and solving the system of linear equations by forward substitution, scaling, and back substitution; and updating the adaptive filter coefficients in accordance with the projected error vector.

The normalized step size can be greater than or equal to 0 and less than or equal to 1. Certain parts of the updating step can be repeated as little as once every N sampling intervals without significantly compromising performance of the adaptive filter. The method is particularly suited for such applications as echo cancellation, noise cancellation, and channel equalization.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
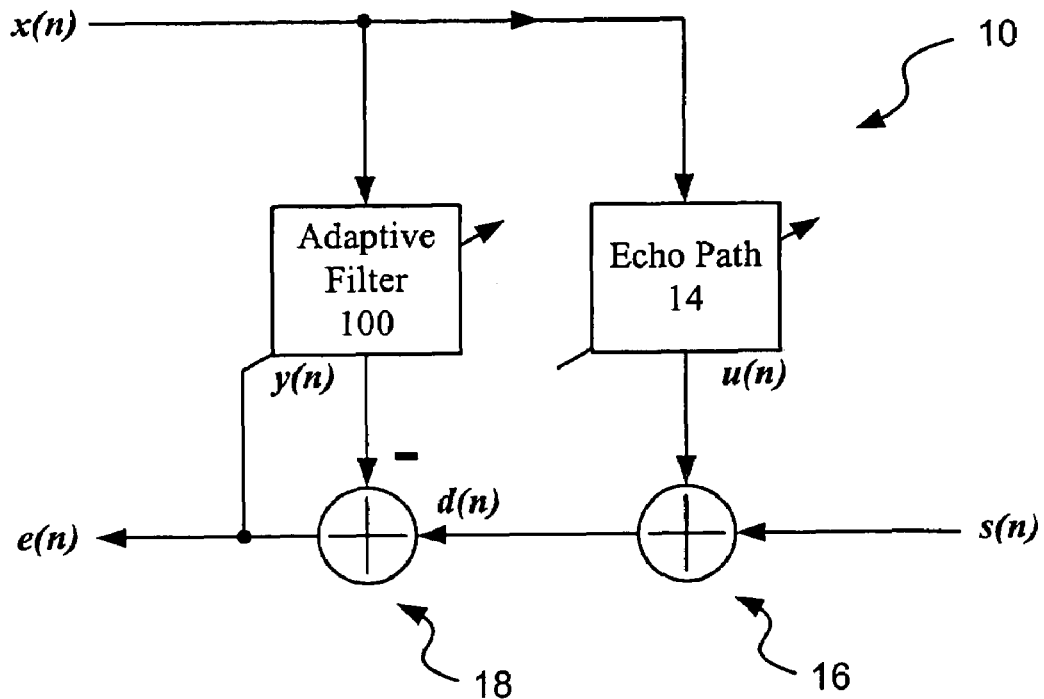
FIG. 1 is a block diagram of an adaptive echo cancellation system.

A simplified block diagram of an adaptive echo cancellation system 10 with an embedded adaptive filter 100 is shown in FIG. 1. x(n), a digitally sampled far-end signal, or reference signal, where n-is the time index, is supplied to the adaptive filter 100 and to the echo path 14, producing an unwanted signal u(n) that is the echo of x(n) through the echo path 14. The perceived near-end signal, d(n), is a sum of the wanted near-end signal s(n), an unwanted u(n), and probably some noise, through summer 16. An echo estimate y(n) from the adaptive filter 100 is subtracted from the perceived near end signal at summer 18 to provide the echo canceller's output e(n). The goal is to let the adaptive filter 100 mimic the echo path 14 so that it produces an output y(n) that is very close to u(n). Therefore, the latter is largely cancelled by the former, and e(n) resembles s(n). Since the echo path 14 can vary over time, the adaptive filter 100 must be able to continuously learn, or adapt to, the new echo path.

Note that, depending on the particular applications, the terms "far-end" and "near-end" may need to be interchanged. For example, with a network echo canceller in a telephone terminal, x(n) in FIG. 1 is actually the near-end signal to be transmitted to the far-end, and d(n) is the signal received from the telephone line connected to the far-end. Although the terminology herein is based on the assumption that x(n) is the far-end signal and d(n) is the signal perceived at the near-end, i.e., the case with an acoustic echo cancellation system in a telephone terminal or a network echo cancellation system in a line card, it is solely for convenience and all systems and methods described herein can be applied to applications with the alternate terminology.

The following conventions in linear algebraic representation are used throughout the following description. Single-underscored symbols, such as $\underline{d}(n)$ and $\underline{X}(n)$, stand for column vectors, and double-underscored symbols, like $\underline{\underline{R}}$, are matrices. A superscript T stands for the transposition of a matrix or vector. A symbol without an underscore denotes a scalar. A subscript, if any, of a matrix or vector indicates the dimension of the array, e.g. $\underline{X}_N$ is an N vector and $\underline{\underline{R}}_N$ an N×N square matrix. Subscripts of scalars are merely indices. If $\underline{X}_N$ is an N vector, then $\underline{X}_{N-1}$ stands for an N−1 vector consisting of the N−1 upper most elements of $\underline{X}_N$ and $\underline{X}_{N-1}$ stands for an N−1 vector consisting of the N−1 lower most elements of $\underline{X}_N$.

Figure 2:
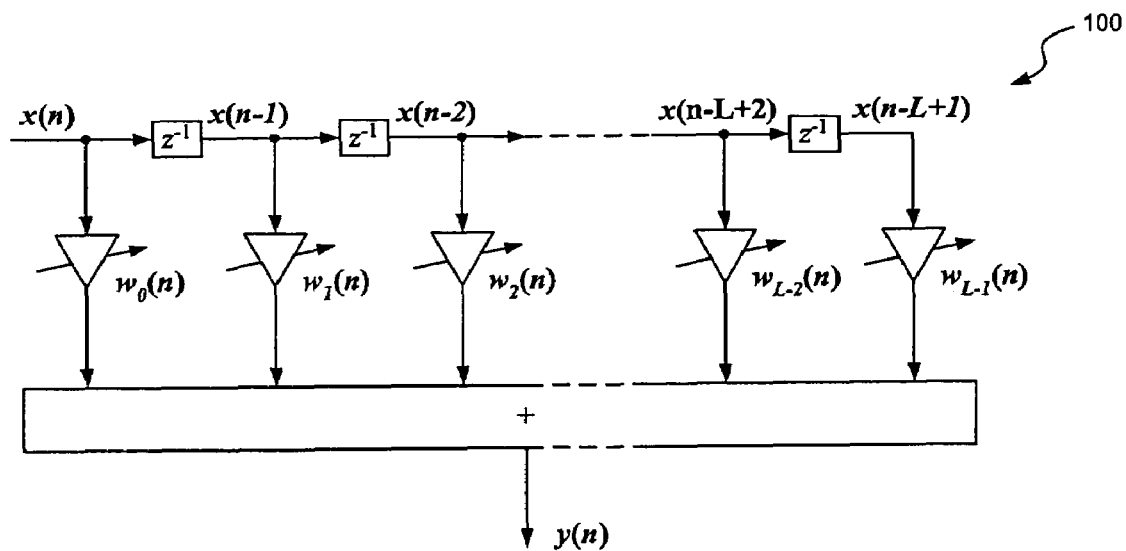
FIG. 2 is a block diagram illustrating the FIR transversal topology of an FIR adaptive filter of the present invention.

The most common topology of the adaptive filter 100 of FIG. 1 is a finite impulse response (FIR) transversal filter, as shown in FIG. 2, where $\{w_0(n), w_1(n), \ldots, w_{L-1}(n)\}$ are coefficients of the adaptive filter. This structure is assumed thoughout the description.

Expressing FIG. 1 and FIG. 2 mathematically, L-dimensional column vectors $$\underline{X}(n) \equiv \begin{bmatrix} x(n) \\ x(n-1) \\ \ldots \\ x(n-L+1) \end{bmatrix} \text{ and } \underline{W}(n) \equiv \begin{bmatrix} w_0(n) \\ w_1(n) \\ \ldots \\ w_{L-1}(n) \end{bmatrix} \quad (1)$$

are defined as the reference input vector and the adaptive filter coefficient vector, respectively. In Eq. (1), L is the length of the adaptive filter 100. The convolution and subtraction of the signals, which derive the output of the adaptive echo cancellation system 10, can then be expressed as $$e(n) \equiv d(n) - y(n) = d(n) - \sum_{l=0}^{L-1} w_l(n)x(n-l) = d(n) - \underline{X}^T(n)\underline{W}(n) \quad (2)$$

where the superscript "T" is the transposition of a vector or matrix.

The particular adaptation method chosen determines the manner in which the filter coefficients, i.e., $\{w_0(n), w_1(n), \ldots, w_{L-1}(n)\}$ or $\underline{W}(n)$, are determined. Adaptation methods of choice should be stable, robust, fast-learning (or converging), and simple to implement.

Certain well known prior art adaptation methods will be now discussed for comparison to the ones of the present invention.

As the work horse in the telecom industry, the normalized mean square (NLMS) method updates the coefficient vector $\underline{W}(n)$ based on the knowledge of the current system performance, i.e.

$$\underline{W}(n+1) = \underline{W}(n) + 2\mu(n)e(n)\underline{X}(n) \quad (3)$$

$$\mu(n) = \frac{\alpha}{\underline{X}^T(n)\underline{X}(n) + \delta}$$

In Eq. (3), the positive number α is the normalized step size, μ(n) is an adaptation step size which controls the rate of adjustment to the coefficients, and δ, being a small positive number, prevents μ(n) from becoming too big when there is little or no reference signal x(n). The computations required by an NLMS filter can be as low as 2L+2 multiply and accumulate (MAC) operations and 1 division (DIV) per sampling interval.

A second adaptation method, the affine projection (AP) method is a generalization of the NLMS. With N being the so-called projection order, the following can be defined:

$$\underline{d}(n) \equiv \begin{bmatrix} d(n) \\ d(n-1) \\ \ldots \\ d(n-N+1) \end{bmatrix}, \quad (4)$$

$$\underline{e}(n) \equiv \begin{bmatrix} e(n) \\ e(n-1) \\ \ldots \\ e(n-N+1) \end{bmatrix}_{\underline{W}(n)}, \quad \underline{\xi}(n) \equiv \begin{bmatrix} x(n) \\ x(n-1) \\ \ldots \\ x(n-N+1) \end{bmatrix}$$

and $$\underline{\underline{X}}(n) \equiv [\underline{X}(n)\underline{X}(n-1)\ldots\underline{X}(n-N+1)] = \quad (5)$$

$$[\underline{\xi}(n)\underline{\xi}(n-1)\ldots\underline{\xi}(n-L+1)]^T$$

$$= \begin{bmatrix} x(n) & x(n-1) & \cdots & x(n-N+1) \\ x(n-1) & x(n-2) & \cdots & x(n-N) \\ \vdots & \vdots & & \vdots \\ x(n-L+1) & x(n-L) & \cdots & x(n-N-L+2) \end{bmatrix}$$

where, $\underline{d}(n)$ and $\underline{e}(n)$ are N-dimensional vectors, and $\underline{\underline{X}}(n)$ is an L×N matrix. Since N is usually much less than the adaptive filter length L, $\underline{\underline{X}}(n)$ is a "portrait," rather than "landscape," matrix. Note that e(n) in Eq. (4) is the a priori error vector—all its elements are obtained with the weight vector equal to $\underline{W}(n)$, as indicated in Eq. (6) below. Thus, the convolution and subtraction according to FIG. 1 results in:

(6)     $\underline{e}(n) = \underline{d}(n) - \underline{\underline{X}}^T(n)\underline{W}(n)$ where $\underline{W}(n)$ is defined in Eq. (1). Updating is achieved by:

$$\underline{\underline{R}}(n)=\underline{X}^T(n)\underline{\underline{X}}(n)+\delta\underline{\underline{I}}$$

$$\underline{\varepsilon}(n)=\underline{\underline{R}}^{-1}(n)\underline{e}(n)$$

$$\underline{W}(n+1)=\underline{W}(n)+\alpha\underline{\underline{X}}(n)\underline{\varepsilon}(n) \qquad (7)$$

where $\underline{\underline{I}}$ is the N×N identity matrix, the input auto-correlation matrix $\underline{\underline{R}}(n)$ is symmetric and positive-definite, and $\alpha$ and $\delta$ play similar roles as they do in Eq. (3). $\alpha$ is a normalized step size satisfying $\alpha\in[0,1]$. $\delta$ is a regularization factor that prevents the auto-correlation matrix $\underline{\underline{R}}(n)$ from becoming ill-conditioned or even rank-deficient, causing instability of the algorithm. It can be seen that an N×N matrix inversion operation, or solving an N-th order symmetric positive-definite linear system, is needed in each sampling interval with the AP filter.

The AP filter offers a very good convergence property but is quite computationally expensive. It needs, in each sampling interval, $2LN+O(N^2)$ MACs (see e.g. Gay et al. (Acoustic Research Department, AT&T Bell Laboratories), "The Fast Affine Projection Algorithm", *Proceedings of the International Conference on Acoustics, Speech, and Signal Processing*, pp. 3023-3026, May 1995). For example, choosing N equal to 5 makes the APA more than five times as complex as the NLMS.

Since the AP filter is impractically expensive computationally, certain simplifications have been suggested (see e.g. Tanaka et al. (NTT Human Interface Laboratories), "Fast Projection Algorithm and Its Step Size Control," *Proceedings of the International Conference on Acoustics, Speech, and Signal Processing*, pp. 945-948, May 1995, and U.S. Pat. No. 5,428,562 to Gay, the contents of which are incorporated herein by reference), to arrive at the so-called fast affine projection (FAP) filter. Note that here the "F," for "fast," means it saves computations or is computationally less expensive, not that it converges faster. In fact by adopting these simplifications, the performance indices, including the convergence speed, will slightly degrade.

Briefly, the FAP filter consists of adopting an approximation $$\underline{e}(n) \approx \begin{bmatrix} e(n) \\ (1-\alpha)\underline{\bar{e}}(n-1) \end{bmatrix} = \begin{bmatrix} e(n) \\ (1-\alpha)e(n-1) \\ (1-\alpha)^2 e(n-2) \\ \vdots \\ (1-\alpha)^{N-1}e(n-N+1) \end{bmatrix} \qquad (8)$$

and certain simplifications to reduce the computational load, which are carried through to the present invention. In Eq. (8), $\underline{\bar{e}}(n)$ is an N−1 vector consisting of the N−1 upper most elements of the N vector $\underline{e}(n)$. To reduce the computational load, the approximation Eq. (8) uses a posteriori errors to replace the a priori ones in Eq. (4); and a matrix inversion to solve the N-th order symmetric positive-definite linear system in Eq. (7)

Focus in the prior art has been primarily on the solution to the N-th order symmetric positive-definite linear system as this is a key issue with the FAP filter, and is the focus of the present invention. A number of prior art solutions of the N-th order symmetric positive-definite linear system in Eq. (7) will now be discussed.

The originally proposed FAP filter uses a so-called "sliding windowed" fast recursive least squares (FRLS) approach to solve the N-th order symmetric positive-definite linear system in Eq. (7), as described in U.S. Pat. No. 5,427,562, to recursively find the solution. This requires a total computational load of 2L+20N MACs and 5 DIVs per sampling interval, and is very difficult and memory-intensive to implement (see e.g. Oh et al. (Texas Instruments and The University of Texas), "A Fast Affine Projection Algorithm for an Acoustic Echo Cancellation Using a Fixed-Point DSP Processor," *Proceedings of the International Conference on Acoustics, Speech, and Signal Processing*, Vol. 5, pp. 4121-4124, 1997; Liu et al. (Bell-Northern Research and INRS-Télécommunications, Université du Québec), "On the Use of a Modified Fast Affine Projection Algorithm in Subbands for Acoustic Echo Cancellation," *Proceedings of 1996 IEEE Digital Signal Processing Workshop*, pp. 354-357, September 1996; and Albu et al. "The Gauss-Seidel Fast Affine Projection Algorithm," *IEEE Workshop on Signal Processing Systems* (SIPS 2002), ISBN 0-7803-75874, pp. 109-114, October 2002).

In a second method, as discussed in Liu et al., supra, a matrix inversion lemma is used twice to explicitly find $\underline{\underline{R}}^{-1}(n)$ at each sampling interval n. In particular, it deems an accurate estimate $\underline{\underline{R}}^{-1}(n-1)$ to start with and recursively derives $\underline{\underline{R}}^{-1}(n)$ based on this estimate and knowledge of the new data $\underline{X}(n)$. The total computations needed are $2L+3N^2+12N$ MACs and 2 DIVs. While slightly more complex than the original FAP filter, this method offers a more accurate estimation for $\underline{\underline{R}}^{-1}(n)$ because a conventional RLS algorithm, instead of a fast version (with inevitable degradations) of it, is used.

The above two approaches have a common problem: there is no feedback in the updating process. An accurate estimate of $\underline{\underline{R}}^{-1}(n)$ relies heavily on an accurate starting point $\underline{\underline{R}}^{-1}(n-1)$. If $\underline{\underline{R}}^{-1}(n-1)$ deviates from its accurate value, the algorithm has no way of knowing that and will keep using it. As a result, inevitable numerical errors in $\underline{\underline{R}}^{-1}(n-1)$ will very likely be propagated to $\underline{\underline{R}}^{-1}(n), \underline{\underline{R}}^{-1}(n+1), \underline{\underline{R}}^{-1}(n+2), \ldots$, and accumulate to a certain degree to make the whole algorithm collapse. A remedy is to periodically re-start a new inversion process in parallel with the existing one, and to replace the latter so as to get rid of the accumulated numerical errors. While this can be a feasible solution for high-precision DSPs such as a floating-point processor, it is not suitable for fixed-point DSP implementations because, given the low numerical precision of such processors, the numerical errors would accumulate so fast that the re-starting period would have to be made impractically small, not to mention the extra complexity associated with this part of the filter.

The following approaches have been proposed to overcome these disadvantages. The first method assumes that the auto-correlation matrix $\underline{\underline{R}}(n)$ is Toeplitz, and, thus, the linear system can be solved relatively efficiently. For example, in U.S. Pat. No. 6,137,881 to Oh et al., the contents of which are incorporated herein by reference, it is believed that a Levinson-Durbin recursion is the method used to solve the Toeplitz linear system. This belief is based on the fact that a Toeplitz assumption is used and a computational complexity of $O(2N^2)$ MACs is asserted. A FAP filter according to this method incurs a total computation load of $2L+2N^2+3N-2$ MACs and N DIVs. This approach is stable, but gives an approximate solution because the actual autocorrelation matrix R(n) is not strictly Toeplitz. Furthermore, the computational load is a quite high, because the solution is division-intensive—a single DIV operation typically takes a general purpose DSP the same time as 20 to 30 MAC operations.

In U.S. Pat. No. 6,754,340, the present inventor proposed a conjugate gradient FAP (CGFAP) filter, a FAP filter using a so-called "conjugate gradient" iterative approach to solve the linear system—without the Toeplitz assumption. This filter has a computational complexity of $2L+2N^2+9N+1$ MACs and only 1 DIV per sampling interval. While CGFAP is stable, it is only meant for the so-called non-relaxed case, i.e., with a large normalized step size α, being equal or close to unity; therefore, it cannot be extended to the general step size case without drastically increasing the computational requirement. This is a restriction in practical applications.

Another approach to solving the linear system was proposed in Albu et al. supra. It is based on the so-called Gauss-Seidel scheme, which is also referred to as a method of successive displacements. This Gauss-Seidel FAP (GSFAP) filter purports to be stable and the total computational load of it is $2L+N^2/p+(5-1/p)N-1$ MACs and 1 DIV per sampling interval, where the rate-reduction factor p can range from 1 to 5, with a larger p resulting in more loss of system performance. However, like the CGFAP filter, this approach is also only suitable for cases where the normalized step size α is, or is close to, unity.

The present invention uses direct, as opposed to iterative, methods to solve the linear system. Thus, the methods are intrinsically stable and robust. The first embodiment applies an $LDL^T$ factorization technique (see generally Gene H. Golub and Charles F. Van Loan, *Matrix Computations*, Second Edition, ISBN 0-8018-3772-3, The Johns Hopkins University Press, 1989) to a symmetric matrix, to find an exact solution to the linear system with an acceptable complexity. The second embodiment takes advantage of certain structural properties of the linear system to provide a reasonably accurate approximate solution with a very low complexity. By incorporating FAP filters featuring the proposed methods to solve the linear system in products such as network and acoustic echo cancellers, active noise control, and hearing aid feedback cancellation, users will be able to enjoy significantly improved (over the NLMS) performance with little or no increase in cost. Generally, the FAP filters with the present invention to solve the N-th order symmetric positive-definite linear system in Eq. (7) are stable, robust, simple, and able to take any step size $α\in[0,1]$.

Taking a closer look at the N-th order symmetric positive-definite linear system reveals certain structural properties, which are taken advantage of in the present invention. As shown in Eq. (7), it is necessary to solve an Nth order symmetric positive-definite system $$\underline{\underline{R}}(n)\underline{\varepsilon}(n) = \underline{e}(n) \quad (9)$$

where $$\underline{\varepsilon}(n) \equiv \begin{bmatrix} \varepsilon_0(n) \\ \varepsilon_1(n) \\ \vdots \\ \varepsilon_{N-1}(n) \end{bmatrix} \text{ and } \underline{e}(n) \equiv \begin{bmatrix} e_0(n) \\ e_1(n) \\ \vdots \\ e_{N-1}(n) \end{bmatrix} \quad (10)$$

are N-dimensional solution and given vectors, respectively, where $\underline{\varepsilon}(n)$ is the projected error vector and $\underline{e}(n)$ is the current known error vector. Furthermore, $\underline{e}(n)$ satisfies $$\underline{e}(n) = \begin{bmatrix} e(n) \\ (1-\alpha)\underline{\bar{e}}(n-1) \end{bmatrix} = \begin{bmatrix} e(n) \\ (1-\alpha)e(n-1) \\ (1-\alpha)^2 e(n-2) \\ \vdots \\ (1-\alpha)^{N-1} e(n-N+1) \end{bmatrix} \quad (11)$$

which is a duplication of Eq. (8). This reveals a first structural property: $\underline{e}(n)$ is a pre-fixed and one position down shifted and scaled version of $\underline{e}(n-1)$ with last element discarded, as expressed in Eq. (11).

Looking now at the auto-correlation matrix $\underline{\underline{R}}(n)$, and examining the definitions in Eqs. (7) and (5), results in $$\underline{\underline{R}}(n) \equiv [r_{ij}(n)] \equiv \begin{bmatrix} r_{00}(n) & r_{01}(n) & \cdots & r_{0,N-1}(n) \\ r_{10}(n) & r_{11}(n) & \cdots & r_{1,N-1}(n) \\ \vdots & \vdots & & \vdots \\ r_{N-1,0}(n) & r_{N-1,1}(n) & \cdots & r_{N-1,N-1}(n) \end{bmatrix} \quad (12)$$

which is an N×N symmetric positive-definite matrix, i.e.

$$r_{ij}(n) = r_{ji}(n), \forall i,j \in [0,N-1] \quad (13)$$

Furthermore, in every sampling interval, the auto correlation matrix $\underline{\underline{R}}(n)$ is shifted one position towards the lower right corner. This, together with the symmetry property, enables $\underline{\underline{R}}(n)$ to be expressed as:

$$\underline{\underline{R}}(n) = \begin{bmatrix} r_0(n) & r_1(n) & r_2(n) & \cdots & r_{N-2}(n) & r_{N-1}(n) \\ r_1(n) & r_0(n-1) & r_1(n-1) & \cdots & r_{N-3}(n-1) & r_{N-2}(n-1) \\ r_2(n) & r_1(n-1) & r_0(n-2) & \cdots & r_{N-4}(n-2) & r_{N-3}(n-2) \\ \vdots & \vdots & \vdots & & \vdots & \vdots \\ r_{N-2}(n) & r_{N-3}(n-1) & r_{N-4}(n-2) & \cdots & r_0(n-N+2) & r_1(n-N+2) \\ r_{N-1}(n) & r_{N-2}(n-1) & r_{N-3}(n-2) & \cdots & r_1(n-N+2) & r_0(n-N+1) \end{bmatrix} \quad (14)$$

Eqs. (7) and (5) mean that each element in Eq. (14) is a sum of L consecutive samples. With the observation window being of the order of N (N<<L) samples, it is reasonable to assume that the elements do not change much within N sampling intervals. Thus, two more structural properties become apparent. According to the second structural property, the auto-correlation matrix $\underline{\underline{R}}(n)$ in Eq. (14) can be approximately regarded as constant over N sampling intervals. According to the third observed structural property, elements on each diagonal of the auto-correlation matrix $\underline{\underline{R}}(n)$ can be approximately regarded as equal. In other words, $\underline{\underline{R}}(n)$ is nearly Toeplitz. Given the second and third structural properties, for convenience, the time index "n" will be omitted in certain parts of this document, where there is no risk of confusion.

First, a solution to the N-th order symmetric positive-definite system of Eq. (9) without any approximation is presented. This is followed by another solution that offers a sub-optimal solution, but at a lower complexity. As used herein, "sub-optimal" means that the solution results in an approximate solution.

The symmetric (but not necessarily Toeplitz) matrix $\underline{\underline{R}}$ can be uniquely factored Into $$\underline{\underline{R}} = \underline{\underline{LDL}}^T \quad (15)$$

where $\underline{D}$ is a diagonal matrix and $\underline{L}$ is a unit lower triangular matrix—with all elements on the main diagonal being unity. Once $\underline{R}$ has been so factored, the N-th order symmetric positive-definite system can now be expressed as $$\underline{LDL}^T \underline{\varepsilon}(n) = \underline{e}(n) \quad (16)$$

and the solution can be found by solving $$\underline{L}\underline{\varepsilon}^{(L)} = \underline{e}(n) [\underline{\varepsilon}^{(L)} = \underline{DL}^T \underline{\varepsilon}(n)] \quad (17)$$

with forward substitution, then $$\underline{D}\underline{\varepsilon}^{(D)} = \underline{\varepsilon}^{(L)} [\underline{\varepsilon}^{(D)} = \underline{L}^T \underline{\varepsilon}(n)] \quad (18)$$

with scaling, and finally $$\underline{L}^T \underline{\varepsilon}(n) = \underline{\varepsilon}^{(D)} \quad (19)$$

with back substitution. Details of this solution are given in Appendix A: LDLT Factorization and System Solving".

If the $LDL^T$ factorization is performed every sampling interval to factor the auto-correlation matrix, a full-rate version of the approach results. The number of MACs and DIVs required are:

$$N^F_{MAC,LDL} = \frac{N^3}{6} + 2N^2 - \frac{7N}{6} \text{ and } N^F_{DIV,LDL} = N \quad (20)$$

where the superscript "F" stands for "full rate."

However, taking note of the second observed structural property, $\underline{R}$ changes slowly over time; therefore, $LDL^T$ factorization does not have to be performed every sampling interval, and can be done at a reduced rate. If the $LDL^T$ factorization is done once every N samples and the computational load is evenly distributed over the N-sample period, then on the average for each sampling interval, only $$N^R_{MAC,F} = \frac{N_{MAC,F}}{N} = \frac{1}{N}\left(\frac{N^3}{6} + N^2 - \frac{7N}{6}\right) = \frac{N^2}{6} + N - \frac{7}{6} \quad (21)$$

MACs and $$N^R_{DIV,F} = \frac{N_{DIV,F}}{N} = \frac{N}{N} = 1 \quad (22)$$

DIV are required to do the $LDL^T$ factorization. In Eqs. (21) and (22), the superscript "R" stands for "reduced rate." Combined with the necessary forward substitution, scaling and back substitution that follow the factorization, only $$N^R_{MAC,LDL} = N^R_{MAC,F} + N_{MAC,FS} + N_{MAC,S} + N_{MAC,BS} \quad (23)$$
$$= \left(\frac{N^2}{6} + N - \frac{7}{6}\right) + \frac{N}{2}(N-1) + N + \frac{N}{2}(N-1)$$
$$\approx \frac{7}{6}N^2 + N - 1$$

MACs and $$N^R_{DIV,LDL} = N^R_{DIV,F} + N_{DIV,FS} + N_{DIV,S} + N_{DIV,BS} = 1 + 0 + 0 + 0 = 1 \quad (24)$$

DIV are needed in each sampling interval to find the solution to solve for the linear system.

Thus, the overall complexity figures for the $LDL^T$ FAP filters are $$N^F_{MAC,LDLFAP} = 2L + \frac{N^3}{6} + 2N^2 + \frac{17N}{6} - 2 \text{ and } N^F_{DIV,LDLFAP} = N \quad (24)$$

for the full-rate $LDL^T$ FAP, and $$N^R_{MAC,LDLFAP} = 2L + \frac{7}{6}N^2 + 5N - 3 \text{ and } N^R_{DIV,LDLFAP} = 1 \quad (26)$$

for the reduced-rate $LDL^T$ FAP.

To summarize, this approach is based on the $LDL^T$ factorization technique. Its full-rate version finds the exact solution, without taking any approximation, at a complexity slightly higher than that of CGFAP with typical values of N (between 5 and 10) for voice applications. The reduced-rate version gives an approximate solution at a complexity lower than CGFAP and comparable to that of GSFAP with the "rate reduction" factor $\rho=1$. However, CGFAP and GSFAP are non-relaxed ($\alpha \approx 1$), whereas the two versions of the $LDL^T$ FAP can take a general step size $\alpha \in [0,1]$.

A summary of the steps and computational complexity for fultrate and reduced-rate $LDL^T$ FAP methods according to the present invention are as shown below.

Initialization (n=−1):

$$\underline{V}(-1)=\underline{0}, \underline{X}(-1)=\underline{0}, \underline{\eta}(-1)=\underline{0}, \underline{R}(-1)=\delta \underline{I}, \underline{e}(-1)=\underline{0} \quad (27)$$

Processing in Sampling Interval n (n=0,1,2, . . . ):

TABLE 1

(28)

| $LDL^T$ FAP | MAC | DIV |
|---|---|---|
| $\underline{R}(n) = \underline{R}(n-1) + \underline{\xi}(n)\underline{\xi}^T(n) - \underline{\xi}(n-L)\underline{\xi}^T(n-L)$ | 2N | |
| $\underline{V}(n) = \underline{V}(n-1) + \alpha \eta_{N-1}(n-1)\underline{X}(n-N)$ | L | |
| $y(n) = \underline{V}^T(n)\underline{X}(n) + \alpha \underline{\bar{\eta}}^T(n-1)\underline{\tilde{R}}(n)$ | L + N − 1 | |
| $e(n) = d(n) - y(n)$ | | |
| $\underline{e}(n) = \begin{bmatrix} e(n) \\ (1-\alpha)\underline{\bar{e}}(n-1) \end{bmatrix}$ | N − 1 | |
| $\underline{\varepsilon}(n) = \underline{R}^{-1}(n)\underline{e}(n)$ | F: $\frac{N^3}{6} + 2N^2 - \frac{7N}{6}$ | N |
| | F: $\frac{7}{6}N^2 + N - 1$ | 1 |
| $\underline{\eta}(n) = \begin{bmatrix} 0 \\ \underline{\eta}(n-1) \end{bmatrix} + \underline{\varepsilon}(n)$ | | |

TABLE 1-continued $$\underline{LDL^T\ FAP} \quad (28)$$

| | MAC | DIV |
|---|---|---|
| Total: | F: $2L + \frac{N^3}{6} 2N^2 + \frac{17N}{6} - 2$ | N |
| | F: $2L + \frac{7}{6}N^2 + 5N - 3$ | 1 |

Note:
$\underline{\xi}(n)$ is defined in Eq. (4),
$\underline{R}(n)$ is the left-most column of $\underline{\underline{R}}(n)$,
$\underline{R}\ (n)$ is an N−1 vector consisting of the N−1 lower elements of the Nvector $\underline{R}(n)$,
$\overline{\underline{\eta}}\ (n)$ is an N−1 vector consisting of the N−1 upper elements of the Nvector $\underline{\eta}\ (n)$, and
"F" stands for "full-rate" and "R" for "reduced-rate."

A second embodiment of the present invention assumes that the auto correlation matrix $\underline{\underline{R}}(n)$ is Toeplitz, as noted in the third observed structural property. A variation of the Levinson-Durbin recursion is used.

Using a subscript to denote an array's dimension, Eq. (9) can be expressed as:

$$\underline{\underline{R}}_N(n)\underline{\varepsilon}_N(n) = \underline{e}_N(n) \quad (29)$$

where $$\underline{\varepsilon}_N(n) \equiv \begin{bmatrix} \varepsilon_0(n) \\ \varepsilon_1(n) \\ \vdots \\ \varepsilon_{N-1}(n) \end{bmatrix} \text{ and } \underline{e}_N(n) \equiv \begin{bmatrix} e_0(n) \\ e_1(n) \\ \vdots \\ e_{N-1}(n) \end{bmatrix} \quad (30)$$

are N-dimensional solution and given vectors, respectively.

To apply the Levinson-Durbin recursion, $\underline{\underline{R}}_N(n)$ must be constant (not time varying), symmetric and positive-definite Toeplitz. In fact, the auto-correlation matrix $\underline{\underline{R}}_N(n)$ varies slowly and can be approximately regarded as constant over N sampling intervals, and $\underline{\underline{R}}_N$ can be regarded as nearly Toeplitz. These features permit the N-th order system Eq. (29) to be expressed as $$\underline{\underline{R}}_N \underline{\varepsilon}_N(n) = \underline{e}_N(n) \quad (31)$$

where $\underline{\underline{R}}_N$ is a constant symmetric and positive-definite Toeplitz matrix. A full Levinson-Durbin recursion requires $$M_{MAC,LD} = 2N^2 - N \quad (32)$$

and $$N_{DIV,LD} = N \quad (33)$$

MACs and DIVs, respectively, to solve Eq. (31).

In order to simplify the solution of Eq. (31), and thereby bring down the complexity figures, we observe that, as a result of $\underline{\underline{R}}_N$ varying slowly, the solution to the corresponding Yule-Walker system (discussed in "Appendix B: Durbin's Recursion for Yule-Walker Systems") also changes slowly over time. In addition, the right-hand side of Eq. (31), $\underline{e}_N(n)$, is a pre-fixed and one position down shifted and scaled version of $\underline{e}(n-1)$ with last element discarded, as observed above:

$$\underline{e}_N(n+1) \equiv \begin{bmatrix} e_0(n+1) \\ e_1(n+1) \\ \vdots \\ e_{N-1}(n+1) \end{bmatrix} = \begin{bmatrix} e_0(n+1) \\ (1-\alpha)e_0(n) \\ (1-\alpha)e_1(n) \\ \vdots \\ (1-\alpha)e_{N-2}(n) \end{bmatrix} = \begin{bmatrix} e_0(n+1) \\ (1-\alpha)\underline{e}_{N-1}(n) \end{bmatrix} \quad (34)$$

where the scalar $(1-\alpha)$ satisfies $0 \leq (1-\alpha) \leq 1$, and $$\underline{e}_{N-1}(n) \equiv \begin{bmatrix} e_0(n) \\ e_1(n) \\ \vdots \\ e_{N-2}(n) \end{bmatrix} \quad (35)$$

In other words, $\underline{e}_N(n+1)$ is a scaled and one-position down-shifted version of $\underline{e}_N(n)$ with the latter's last element discarded and a fresh sample $e_0(n+1)$ prefixed.

The problem can be phrased as: given the solution $\underline{\varepsilon}_N(n)$ to Eq. (31), we need to find the solution $\underline{\varepsilon}_N(n+1)$ to $$\underline{\underline{R}}_N \underline{\varepsilon}_N(n+1) = \underline{e}_N(n+1) \quad (36)$$

where $\underline{e}_N(n+1)$ is given by Eq. (34).

The idea behind the proposed approach is to make use of this observation in relation to $\underline{e}_N(n)$ and the available $\underline{\varepsilon}_N(n)$ in order to obtain $\underline{\varepsilon}_N(n+1)$ with less effort than that with the Levinson-Durbin's recursion, which can solve Eq. (36), but at the cost given above. The filtering method performs backward-recursion to derive from $\underline{\varepsilon}_N(n)$ a vector $\underline{Z}_{N-1}$, solution to $$\underline{\underline{R}}_{N-1} \underline{Z}_{N-1} = \underline{e}_{N-1}(n) \quad (37)$$

followed by forward-recursion on $\underline{Z}_{N-1}$ to obtain $\underline{\varepsilon}_N(n+1)$.

Equation (31) can be expressed as $$\begin{bmatrix} \underline{\underline{R}}_{N-1} & \underline{\underline{E}}_{N-1}\underline{R}_{N-1} \\ \underline{R}^T_{N-1}\underline{\underline{E}}_{N-1} & r_0 \end{bmatrix} \begin{bmatrix} \underline{\varepsilon}_{N-1}(n) \\ \varepsilon_{N-1}(n) \end{bmatrix} = \begin{bmatrix} \underline{e}_{N-1}(n) \\ e_{N-1}(n) \end{bmatrix} \quad (38)$$

where the exchange matrix $\underline{\underline{E}}_{N-1}$ is an (N−1)-th mirror image of the identity matrix $\underline{\underline{I}}_{N-1}$, and $$\underline{R}_{N-1} \equiv \begin{bmatrix} r_1 \\ r_2 \\ \vdots \\ r_{N-1} \end{bmatrix} \quad (39)$$

Using Eq. (37), Eq. (38) can be partially expanded into $$\underline{\underline{R}}_{N-1}\underline{\varepsilon}_{N-1}(n) + \varepsilon_{N-1}(n)\underline{\underline{E}}_{N-1}\underline{R}_{N-1} = \underline{e}_{N-1}(n) = \underline{\underline{R}}_{N-1}\underline{Z}_{N-1} \quad (40)$$

and, since $\underline{\underline{R}}_{N-1}$ is persymmetric (i.e. symmetric about its upper right and lower left diagonal) such that $\underline{\underline{R}}_{N-1}\underline{\underline{E}}_{N-1} = \underline{\underline{E}}_{N-1}\underline{\underline{R}}_{N-1}$ and $(\underline{\underline{R}}_{N-1}\underline{\underline{E}}_{N-1})^{-1} = (\underline{\underline{E}}_{N-1}\underline{\underline{R}}_{N-1})^{-1}$, then $$Z_{N-1} = \varepsilon_{N-1}(n) + \varepsilon_{N-1}(n)\underline{R}_{N-1}^{-1}\underline{E}_{N-1}R_{N-1} \quad (41)$$
$$= \varepsilon_{N-1}(n) + \varepsilon_{N-1}(n)\underline{E}_{N-1}\underline{R}_{N-1}^{-1}R_{N-1}$$
$$= \varepsilon_{N-1}(n) - \varepsilon_{N-1}(n)\underline{E}_{N-1}\underline{Y}_{N-1}$$

Eq. (41) can be solved using an (N−1)-th order Yule-Walker system $$\underline{R}_N \underline{Y}_{N-1} = -\underline{R}_{N-1} \quad (42)$$

to find $\underline{Y}_{N-1}$, as is discussed in Appendix B.

Next, at time n+1, Eq. (36) with Eq. (34) substituted in can be expressed as $$\begin{bmatrix} r_0 & R_{N-1}^T \\ \underline{R}_{N-1} & \underline{R}_{N-1} \end{bmatrix} \begin{bmatrix} \varepsilon_0(n+1) \\ \underline{\tilde{\varepsilon}}_{N-1}(n+1) \end{bmatrix} = \begin{bmatrix} e_0(n+1) \\ (1-\alpha)\underline{e}_{N-1}(n) \end{bmatrix} \quad (43)$$

where $$\underline{\tilde{\varepsilon}}_{N-1}(n+1) \equiv \begin{bmatrix} \varepsilon_1(n+1) \\ \varepsilon_2(n+1) \\ \vdots \\ \varepsilon_{N-1}(n+1) \end{bmatrix} \quad (44)$$

Expanding Eq. (43) and using Eq. (37) results in $$r_0\varepsilon_0(n+1) + \underline{R}_{N-1}^T \underline{\tilde{\varepsilon}}_{N-1}(n+1) = e_0(n+1) \quad (45)$$

and $$\varepsilon_0(n+1)\underline{R}_{N-1} + \underline{R}_{N-1}\underline{\tilde{\varepsilon}}_{N-1}(n+1) = (1-\alpha)\underline{e}_{N-1}(n) = (1-\alpha)\underline{R}_{N-1}Z_{N-1} \quad (46)$$

From Eq. (46) and using Eq. (42), part of the projected error vector can be expressed as:

$$\underline{\tilde{\varepsilon}}_{N-1}(n+1) = \quad (47)$$
$$(1-\alpha)Z_{N-1} - \varepsilon_0(n+1)\underline{R}_{N-1}^{-1}R_{N-1} = (1-\alpha)Z_{N-1} + \varepsilon_0(n+1)\underline{Y}_{N-1}$$

which is then substituted into Eq. (45) so that $$r_0\varepsilon_0(n+1) = e_0(n+1) - \underline{R}_{N-1}^T \underline{\tilde{\varepsilon}}_{N-1}(n+1) \quad (48)$$
$$= e_0(n+1) - \underline{R}_{N-1}^T[(1-\alpha)Z_{N-1} + \varepsilon_0(n+1)\underline{Y}_{N-1}]$$

or $$\varepsilon_0(n+1) = \frac{e_0(n+1) - (1-\alpha)\underline{R}_{N-1}^T Z_{N-1}}{r_0 + \underline{R}_{N-1}^T \underline{Y}_{N-1}} \quad (49)$$

Thus, this embodiment of the present invention recursively finds the solution to Eq. (36) given the solution to Eq. (31), and can be summarized as $$\underline{T}_{N-1} = (1-\alpha)\left[\underline{\varepsilon}_{N-1}(n) - \varepsilon_{N-1}(n)\underline{E}_{N-1}\underline{Y}_{N-1}\right] \quad (50)$$
$$\varepsilon_0(n+1) = \frac{e_0(n+1) - \underline{R}_{N-1}^T \underline{T}_{N-1}}{r_0 + \underline{R}_{N-1}^T \underline{Y}_{N-1}}$$
$$\underline{\tilde{\varepsilon}}_{N-1}(n+1) = \underline{T}_{N-1} + \varepsilon_0(n+1)\underline{Y}_{N-1}$$

where $\underline{T}_{N-1}$ equals $(1-\alpha)\underline{Z}_{N-1}$ in previous derivations. This approach can be described as "reciprocating recursion with prefixing and shifting;" and is therefore, abbreviated as a "RATCHET approach."

Looking for a simpler way of finding $\varepsilon_0(n+1)$ in Eq. (50). Equation (110) in Appendix B indicates that $$\frac{1}{r_0 + \underline{R}_{N-1}^T \underline{Y}_{N-1}} = \rho_{N-1} \quad (51)$$

Since the RATCHET filter relies on an (N−1)-th order Durbin's recursion to provide $\underline{Y}_{N-1}$, $\rho_{N-2}$ is already available when $\underline{Y}_{N-1}$ has been found. Thus, Eq. (51) can be found recursively by use of Eq. (112) in Appendix B, $$\rho_{N-1} = \frac{\rho_{N-2}}{1 - y_{N-2}^2} \quad (52)$$

at an expense of $$N_{MAC,RHO} = 1 \text{ and } N_{DIV,RHO} = 1 \quad (53)$$

MAC and DIV, respectively. This is less expensive than directly calculating the denominator for $\varepsilon_0(n+1)$ in Eq. (50).

Equation (50) can then be re-written as $$\underline{T}_{N-1} = (1-\alpha)[\underline{\varepsilon}_{N-1}(n) - \varepsilon_{N-1}(n)\underline{E}_{N-1}\underline{Y}_{N-1}]$$
$$\varepsilon_0(n+1) = \rho_{N-1}[e_0(n+1) - \underline{R}_{N-1}^T \underline{T}_{N-1}]$$
$$\underline{\tilde{\varepsilon}}_{N-1}(n+1) = \underline{T}_{N-1} + \varepsilon_0(n+1)\underline{Y}_{N-1} \quad (54)$$

where it is assumed that Eq. (52) has been appended to the end of the Durbin's recursion process, so that $\rho_{N-1}$ is available.

The RATCHET method can, thus, be implemented as $$k = 0, 1, \ldots, N-2: \quad (55)$$
$$t_k = (1-\alpha)(\varepsilon_k - \varepsilon_{N-1}y_{N-2-k})$$
$$\varepsilon_0 = \rho_{N-1}\left(e_0 - \sum_{k=0}^{N-2} r_{k+1}t_k\right)$$
$$k = 0, 1, \ldots, N-2:$$
$$\varepsilon_{k+1} = t_k + \varepsilon_0 y_k$$

where $\{t_0, t_1, \ldots, t_{N-2}\}$ are temporary storage elements. In Eq. (55), we let $\underline{\varepsilon}_N(n+1)$ overwrite $\underline{\varepsilon}_N(n)$ in order to save memory needs.

The numbers of MACs and DIVs needed to implement this solution are $$N_{MAC,RAT} = 2(N-1) + N + (N-1) = 4N-3 \quad (56)$$

and $$N_{DIV,RAT} = 0 \quad (57)$$

respectively.

If it is desired that the (N−1)-th order Yule-Walker solution be updated every sampling interval, i.e., at a full-rate, then the total numbers of MACs and DIVs for finding $\underline{\varepsilon}_N(n+1)$ given $\underline{\varepsilon}_N(n)$ is $$N_{MAC}^F = N_{MAC,YW} + N_{MAC,RHO} + N_{MAC,RAT} = (N^2 - N - 1) + \quad (58)$$
$$1 + (4N - 3)$$
$$= N^2 + 3N - 3$$

and $$N_{DIV}^F = N_{DIV,YW} + N_{DIV,RHO} + N_{DIV,RAT} = (N - 1) + 1 + 0 = N \quad (59)$$

respectively. Thus a full-rate RATCHET filter, which produces the same results as the Levinson-Durbin FAP filter, only requires about half as many MACs.

Furthermore, since $\underline{R}_{N-1}$ changes slowly over time, a full-rate solution need not be implemented. Instead, the computation for the (N−1)-th order Yule-Walker solution can be done once every N sampling intervals and evenly distributed over the N-sample period, resulting in a reduced-rate RACHET filter method. On average for each sampling interval, only $$N_{MAC}^R = \frac{N_{MAC,YW} + N_{MAC,RHO}}{N} + N_{MAC,RAT} = \quad (60)$$
$$\frac{(N^2 - N - 1) + 1}{N} + (4N - 3)$$
$$= 5N - 4$$

MACs and $$N_{DIV}^R = \frac{N_{DIV,YW} + N_{DIV,RHO}}{N} + N_{DIV,RAT} = \frac{(N-1)+1}{N} + 0 = 1 \quad (61)$$

DIV are needed to recursively solve Eq. (36). Thus, the reduced-rate RATCHET approach offers significant computational savings over the Levinson-Durbin FAP method, the computational requirements of which are given above at Eq. (32) and Eq. (33).

In addition, for the non-relaxed case, i.e. where the normalized step size α is at, or close to, unity, the RATCHET method Eq. (54) can be further simplified such that:

$$\varepsilon_0(n+1) = \rho_{N-1} e_0(n+1) \quad (62)$$
$$\tilde{\varepsilon}_{N-1}(n+1) = \varepsilon_0(n+1) \underline{Y}_{N-1}$$

or $$\underline{\varepsilon}(n+1) = \rho_{N-1} e_0(n+1) \begin{bmatrix} 1 \\ \underline{Y}_{N-1} \end{bmatrix} \quad (63)$$

at a cost of only $N_{MAC,RAT}^{NX}=N$ MACs and $N_{DIV,RAT}^{NX}=0$ DIVs per sampling interval, where the superscript NX denotes "non-relaxed". This is a further reduction over the complexity given in Eq. (56) and Eq. (57) for the full-rate RATCHET method. The complexity is improved even further in the case of the reduced rate RATCHET method. On average, for each sampling interval only $$N_{MAC}^{R,NX} = \frac{N_{MAC,YW} + N_{MAC,RHO}}{N} + N_{MAC,RAT}^{NX} = \quad (64)$$
$$\frac{(N^2 - N - 1) + 1}{N} + N = 2N - 1$$

MACs and $$N_{DIV}^{R,NX} = \frac{N_{DIV,YW} + N_{DIV,RHO}}{N} + N_{DIV,RAT}^{NX} = \frac{(N-1)+1}{N} + 0 = 1 \quad (65)$$

DIV to recursively solve Eq. (36).

To summarize, the RATCHET methods of the present invention provide a method for directly solving the linear system involving the auto-correlation matrix $\underline{\underline{R}}(n)$ by (1) using a Durbin's recursion to solve an (N−1)-th order Yule-Walker system and (2) by finding the solution to the linear system based on the Yule-Walker solution. Due to the fact that $\underline{\underline{R}}(n)$ is nearly Toeplitz and can be considered constant over N sampling intervals, the Durbin's recursion can be performed at a reduced rate—for example, once every N sampling intervals—without significantly affecting the performance. This results in a computational saving from O ($N^2$) to O (N) for this recursion step; and, due to the fact that the N-dimensional solution vector $\underline{e}(n)$ is a pre-fixed and one position down shifted and scaled version of $\underline{e}(n-1)$ with the last element discarded, the Levinson's recursion, which requires N steps to complete, can be replaced by a 2-step reciprocating recursion method. This reduces the computational complexity from O ($N^2$) to O (4N) for this recursion step.

After initialization steps, as shown in Eq. (66), Eq. (69), and Eq. (72), the full-rate RATCHET FAP, reduced-rate RATCHET FAP, and the non-relaxed version of the reduced-rate RATCHET FAP filtering methods can be summarized as follows in Tables 2, 3, and 4.

Initialization (n=−1)

$$\underline{V}(-1) = \underline{0}, \underline{X}(-1) = \underline{0}, \underline{\eta}(-1) = \underline{0}, \underline{e}(-1) = \underline{0}, \gamma = 1 - \alpha, R = \begin{bmatrix} \delta \\ 0 \\ \vdots \\ 0 \end{bmatrix} \quad (66)$$

Processing in sampling interval n (n=0,1,2...):

TABLE 2

| Full-rate RATCHET FAP | | |
|---|---|---|
| | MAC | DIV |
| $\underline{R} = \underline{R} + x(n)\underline{\xi}(n) - x(n-L)\underline{\xi}(n-L)$ | 2N | |
| $\underline{V}(n) = \underline{V}(n-1) + a\eta_{N-1}(n-1)\underline{X}(n-N)$ | L | |
| $y(n) = \underline{V}^T(n)\underline{X}(n) + a\underline{\bar{\eta}}^T(n-1)\tilde{R}$ | L + N − 1 | |
| $e(n) = d(n) - y(n)$ | | |

TABLE 2-continued

Full-rate RATCHET FAP

| | MAC | DIV | |
|---|---|---|---|
| $\rho = 1/r_0; y_0 = -\rho r_1$<br>$k = 1, 2, \ldots, N-2:$<br>$\rho = \rho/(1 - y_{k-1}^2)$<br>$y_k = -\rho[r_{k+1} + \underline{R}_k^T \underline{E}_k \underline{Y}_k]$<br>$\underline{Y}_k = \underline{Y}_k + y_k \underline{E}_k \underline{Y}_k$ | $N^2 - N - 1$ | $N - 1$ | Durbin's recursion |
| $\rho = \rho/(1 - y_{N-1}^2)$ | 1 | 1 | find ρ |
| $T_{N-1} = \gamma\left[\underline{\varepsilon}_{N-1}(n-1) - \varepsilon_{N-1}(n-1)\underline{E}_{N-1}\underline{Y}_{N-1}\right]$<br>$\varepsilon_0(n) = \rho[e(n) - \underline{R}_{N-1}^T \underline{T}_{N-1}]$<br>$\underline{\tilde{\varepsilon}}_{N-1}(n) = \underline{T}_{N-1} + \varepsilon_0(n)\underline{Y}_{N-1}$<br>$\underline{\eta}(n) = \begin{bmatrix} \varepsilon_0(n) \\ \overline{\eta}(n-1) + \underline{\tilde{\varepsilon}}_{N-1}(n) \end{bmatrix}$ | $4N - 3$ | | RATCHET |
| Total: | $2L + N^2 + 6N - 4$ | N | |

Note:
  $\underline{\xi}(n)$ is defined in Eq. (4);
  the N vector $\underline{R} = [\delta + r_0 \; r_1 \ldots r_{n-1}]^T$ (67) is the left-most column of $\underline{\underline{R}}(n)$, the rest of which does not need to be stored;
  $\underline{\tilde{R}}$ is an N−1 vector consisting of the N−1 lower elements of $\underline{R}$;
  $\overline{\eta}(n)$ is an N−1 vector consisting of the N−1 upper elements of the N vector $\underline{\eta}(n)$;
  the goal of the three boxes marked "Durbin's recursion," "Find ρ," and "RATCHET," respectively, is to find $\underline{\epsilon}(n) = \underline{\underline{R}}^{-1}(n)\underline{e}(n)$;
  the vector $\underline{e}(n)$ does not need to be explicitly calculated; and $$\underline{Y}_{N-1} = \begin{bmatrix} \underline{Y}_{N-2} \\ y_{N-2} \end{bmatrix} \quad (68)$$

Initialization (n=−1):

$$\underline{V}(-1)=\underline{0}, \underline{X}(-1)=\underline{0}, \underline{e}(-1)=\underline{0}, \underline{R}=[\delta 0 \ldots 0]^T, \underline{Y}_{N-1}^0= \underline{0}, \rho^0=1/\delta, \gamma=1-\alpha \quad (69)$$

Processing in sampling interval n(n=0, 1, 2 ...):

TABLE 3

Reduced-rate RATCHET FAP

| | MAC | DIV | |
|---|---|---|---|
| $\underline{R} = \underline{R} + x(n)\underline{\xi}(n) - x(n-L)\underline{\xi}(n-L)$ | 2N | | |
| $\underline{V}(n) = \underline{V}(n-1) + \alpha\eta_{N-1}(n-1)\underline{X}(n-N)$ | L | | |
| $y(n) = \underline{V}^T(n)\underline{X}(n) + \alpha\overline{\eta}^T(n-1)\underline{\tilde{R}}$ | $L + N - 1$ | | |
| $e(n) = d(n) - y(n)$ | | | |
| If n/N = k (integer)<br>$\underline{Y}_{N-1} = \underline{Y}_{N-1}^0; \rho = \rho^0$ | | | Once every N samples |
| Calculate during $n \in [kN, (k+1)N):$<br>$\rho^0 = 1/r_0; y_0^0 = -\rho^0 r_1$<br>$k = 1, 2, \ldots, N-2:$<br>$\rho^0 = \rho^0/[1 - (y_{k-1}^0)^2]$<br>$y_k^0 = -\rho^0[r_{k+1} + \underline{R}_k^T \underline{E}_k \underline{Y}_k^0]$<br>$\underline{Y}_k^0 = \underline{Y}_k^0 + y_k \underline{E}_k \underline{Y}_k^0$ | $\dfrac{N^2 - N - 1}{N}$ | $\dfrac{N-1}{N}$ | Durbin's recursion |

TABLE 3-continued

Reduced-rate RATCHET FAP

| | MAC | DIV | |
|---|---|---|---|
| Calculate at end of $n \in [kn, (k+1)N]$: <br> $\rho^0 = \rho^0 / \left[1 - (y_{N-2}^0)^2\right]$ | 1/N | 1/N | Find $\rho$ |
| $\underline{T}_{N-1} = \gamma\left[\underline{\varepsilon}_{N-1}(n-1) - \varepsilon_{N-1}(n-1)\underline{E}_{N-1}\underline{Y}_{N-1}\right]$ <br> $\varepsilon_0(n) = \rho[e(n) - \underline{R}_{N-1}^T \underline{T}_{N-1}]$ <br> $\underline{\tilde{\varepsilon}}_{N-1}(n) = \underline{T}_{N-1} + \varepsilon_0(n)\underline{Y}_{N-1}$ <br> $\underline{\eta}(n) = \begin{bmatrix} \varepsilon_0(n) \\ \overline{\eta}(n-1) + \underline{\tilde{\varepsilon}}_{N-1}(n) \end{bmatrix}$ | 4N − 3 | | RATCHET |
| Total: | 2L + 8N − 5 | 1 | |

Note:
$\underline{\xi}(n)$ is defined in Eq.(4);
the N vector $\underline{R} = [\delta + r_0\ r_1\ \ldots\ r_{N-1}]^T$ (70) is the left-most column of $\underline{R}(n)$, the rest of which does not need to be stored;
$\underline{R}$ is an N−1 vector consisting of the N−1 lower elements of $\underline{R}$;
$\overline{\eta}(n)$ is an N−1 vector consisting of the N−1 upper elements of the N vector $\underline{\eta}(n)$;
the purpose of the three boxes marked "Durbin's recursion," "Find $\rho$," and "RATCHET," respectively, is to find $\underline{\varepsilon}(n) = \underline{R}^{-1}(n)\underline{e}(n)$;
the vector $\underline{e}(n)$ does not need to be explicitly calculated; and $$\underline{Y}_{N-1}^0 = \begin{bmatrix} \underline{Y}_{N-2}^0 \\ y_{N-2}^0 \end{bmatrix} \quad (71)$$

Initialization (n=−1):

$$\underline{V}(-1)=\underline{0}, \underline{X}(-1)=\underline{0}, \underline{\eta}(-1)=\underline{0}, \underline{e}(-1)=\underline{0}$$

$$\underline{R}=[\delta 0 \ldots 0]^T, \underline{Y}_{N-1}^0=\underline{0}, \rho^0=1/\delta \quad (72)$$

Processing in sampling interval n (n=0, 1, 2, …):

TABLE 4

Reduced-rate RATCHET FAP – non-relaxed

| | MAC | DIV | |
|---|---|---|---|
| $\underline{R} = \underline{R} + x(n)\underline{\xi}(n) - x(n-L)\underline{\xi}(n-L)$ | 2N | | |
| $\underline{V}(n) = \underline{V}(n-1) + \alpha\eta_{N-1}(n-1)\underline{X}(n-N)$ | L | | |
| $y(n) = \underline{V}^T(n)\underline{X}(n) + \alpha\overline{\eta}^T(n-1)\underline{\tilde{R}}$ | L + N − 1 | | |
| $e(n) = d(n) - y(n)$ | | | |
| If n/N = k (integer) <br> $\underline{Y}_{N-1} = \underline{Y}_{N-1}^0; \rho = \rho^0$ | | | Once every N samples |
| Calculate during $n \in [kn, (k+1)N]$: <br> $\rho^0 = 1/r_0; y_0^0 = -\rho^0 r_1$ <br> $k = 1, 2, \ldots, N-2$: <br> $\rho^0 = \rho^0 / \left[1 - (y_{k-1}^0)^2\right]$ <br> $y_k^0 = -\rho^0\left[r_{k+1} + \underline{R}_k^T \underline{E}_k \underline{Y}_k^0\right]$ <br> $\underline{Y}_k^0 = \underline{Y}_k^0 + y_k\underline{E}_k\underline{Y}_k^0$ | $\dfrac{N^2 - N - 1}{N}$ | $\dfrac{N-1}{N}$ | Durbin's recursion |
| Calculate at end of $n \in [kn, (k+1)N]$: <br> $\rho^0 = \rho^0 / \left[1 - (y_{N-2}^0)^2\right]$ | 1/N | 1/N | Find $\rho^0$ |

TABLE 4-continued

Reduced-rate RATCHET FAP – non-relaxed

| | MAC | DIV | |
|---|---|---|---|
| $\underline{\varepsilon}(n) = \rho e(n) \begin{bmatrix} 1 \\ \underline{Y}_{N-1} \end{bmatrix}$ | N | | RATCHET |
| $\underline{\eta}(n) = \begin{bmatrix} 0 \\ \underline{\eta}(n-1) \end{bmatrix} + \underline{\varepsilon}(n)$ | | | |
| Total: | 2L + 5N − 2 | 1 | |

Note:
 $\underline{\xi}(n)$ is defined in Eq.(4);
 the N vector $\underline{R}=[\delta+r_0 r_1 \ldots r_{N-1}]^T$ (73) is the left-most column of $\underline{\underline{R}}(n)$, the rest of which does not need to be stored;
 $\underline{\tilde{R}}$ is an N−1 vector consisting of the N=1 lower elements of $\underline{R}$;
 $\underline{\tilde{\eta}}(n)$ is an N=1 vector consisting of the N=1 upper elements of the N vector $\underline{\eta}(n)$;
 the purpose of the three boxes marked "Durbin's recursion," "find$\rho^0$," and "RATCHET," respectively, is to find $\underline{\varepsilon}(n) = \underline{\underline{R}}^{-1}(n)\underline{e}(n)$;
 the vector $\underline{e}(n)$ does not need to be explicitly calculated; and $$\underline{Y}_{N-1}^0 = \begin{bmatrix} \underline{Y}_{N-2}^0 \\ y_{N-2}^0 \end{bmatrix} \quad (74)$$

Stability of the RATCHET filter may be called into question since the projected error vector $\underline{\varepsilon}_N(n+1)$ partially based on the projected error vector $\underline{\varepsilon}_N(n)$; therefore, numerical errors could potentially propagate and accumulate in the sequence of solutions. This should not be an issue because, in each sampling interval n; numerical errors in $\underline{\varepsilon}_N(n)$ and therefore in $\underline{Z}_{N-1}$, if any, are scaled down by a factor $(1-\alpha)$ [$0 \leq (1-\alpha) \leq 1$] before being used to construct $\underline{\varepsilon}_N(n+1)$; and even if $\alpha=0$ so that $(1-\alpha)=1$, i.e., the numerical errors are not attenuated over time, the errors are still shifted one position downwards—towards the end of the vector $\underline{Z}_{N-1}$—in each sampling interval; therefore, they will eventually be discarded and no longer impact subsequent solutions—no matter what the value of $(1-\alpha)$ is.

Simulation results support the above argument. That is, the FAP featuring the RATCHET method stays stable. Some preliminary simulations have been performed on the two FAP filters presented herein at their respective full and reduced rates. It has been observed so far that both filters stay stable for the entire course of each test case that was run, and in terms of convergence speed, RATCHET FAP is slightly inferior to $LDL^T$ FAP, and the respective reduced-rate versions are slightly worse than their full-rate counterparts. However, both the $LDL^T$ FAP and RATCHET FAP, at full and reduced rates, converge much faster than an NLMS adaptive filter.

A comparison between the FAP filters of the prior art and our present filters is shown in Table 4.

TABLE 4

Comparison between various adaptive filters

| | | Algorithm | | Convergence | Relax-ability | Complexity MAC in excess of 2L | DIV | Comment |
|---|---|---|---|---|---|---|---|---|
| Non-FAP | | NLMS | | Slow | Not Applicable | 2 | 1 | Work horse |
| | | RLS | | Fastest | | Very High | | Numerical Issues |
| FAP | Prior Art | Original FAP | | Fast | Yes | 20N | 5 | |
| | | Levinson-Durbin FAP | | | | $2N^2 + 3N - 2$ | N | Approximate |
| | | CGFAP | | | No | $2N^2 + 9N + 1$ | 1 | Only for large step size α |
| | | GSFAP | | | | $N^2/p + (5 - 1/p)N - 1, 1 \leq p \leq 5$ | 1 | |
| | Invented | $LDL^T$ FAP | Full rate | | Yes | $N^3/6 + 2N^2 + 17N/6 - 2$ | N | Exact solution |
| | | | Reduced Rate | | | $7N^2/6 + 5N - 3$ | 1 | Approximate |
| | | RATCHET FAP | Full rate | | | $N^2 + 6N - 4$ | N | |
| | | | Reduced Rate | General | | 8N − 5 | 1 | |
| | | | | Non-relaxed | No | 5N − 2 | 1 | Approximate and only for large step size α |

Figure 3:
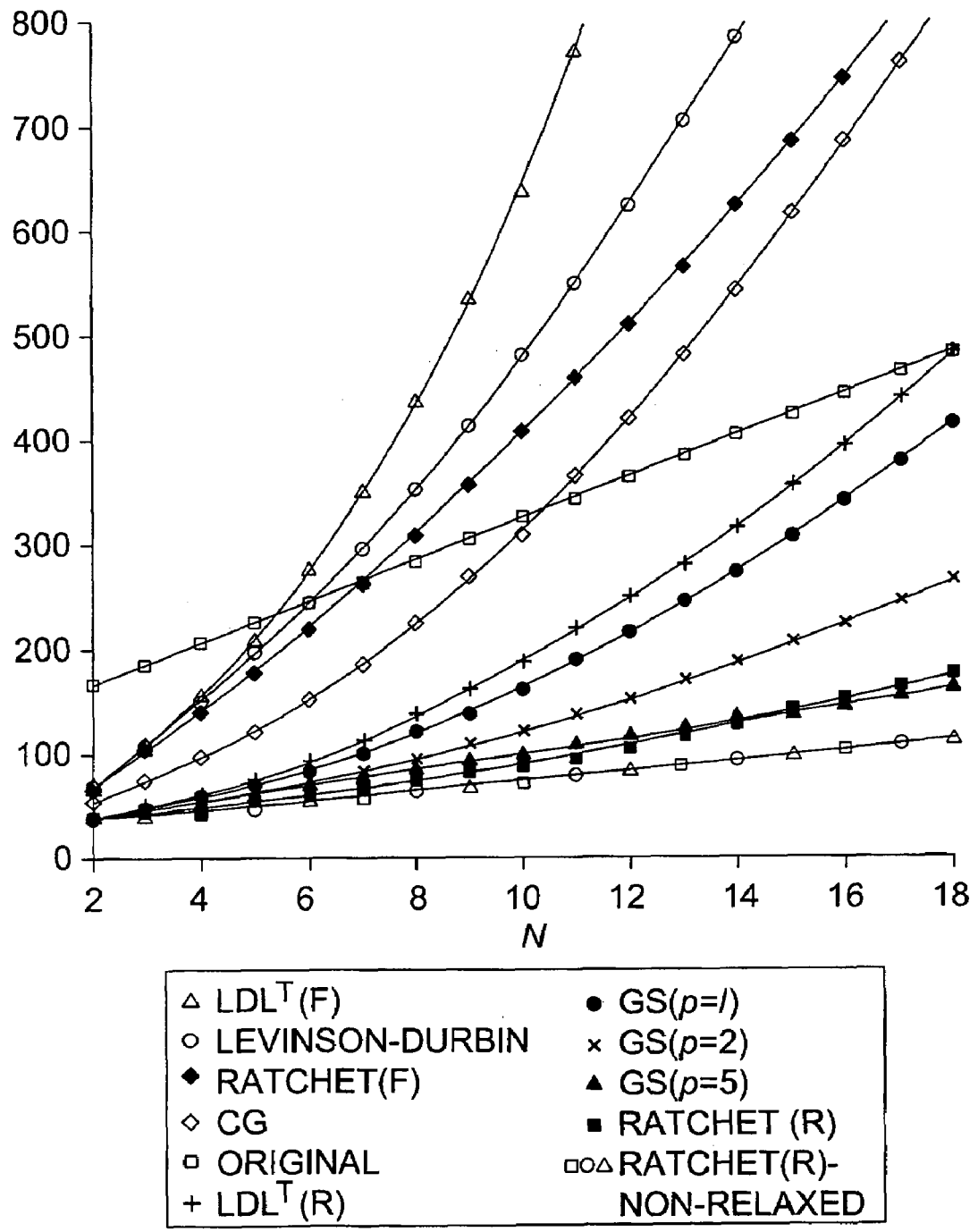
FIG. 3 is a graph comparing the complexity of FAP algorithms.
Figure 4:
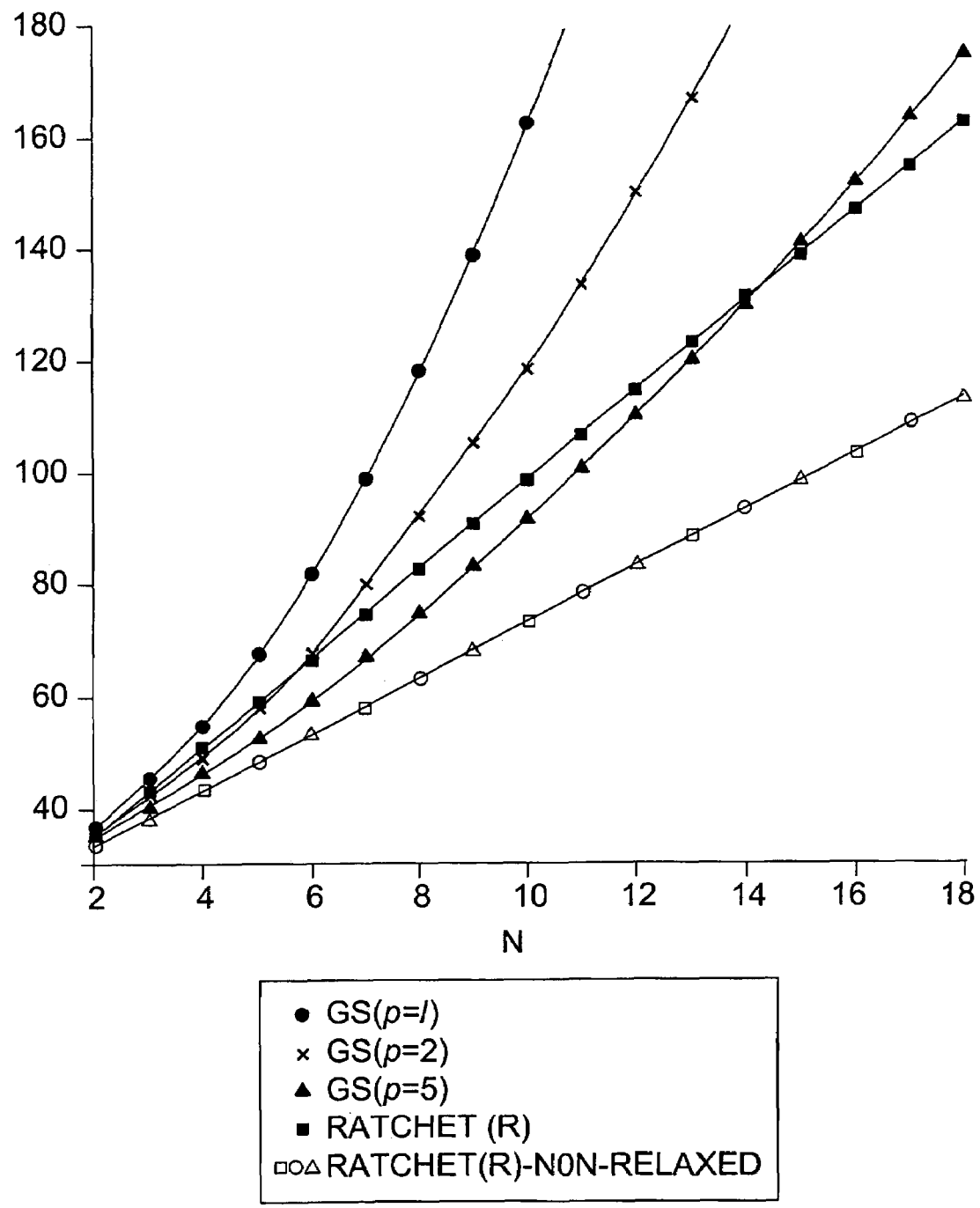
FIG. 4 is a graph comparing the complexity of FAP algorithms.

The complexity figures in Table 4 are plotted in FIG. 3, where each DIV is counted as 25 MACs, because it takes approximately 20 to 30 cycles for a typical commercial DSP to perform a DIV while it takes only 1 cycle for it to do a MAC. In order to compare the GSFAP and RATCHET FAP clearly, the Y-scale of a portion of FIG. 3 is enlarged and shown in FIG. 4.

The advantages of the present invention will be apparent to those of skill in the art. The RATCHET FAP at the reduced rate provides not only a stable filter, but with complexity in the order of O(N), while other stable FAP filters have a complexity of the order of $O(N^2)$. The reduced rate RATCHET FAP is also simpler than previously proposed FAP filters. With the projection order N between 4 and 18, a range particularly suitable for voice applications, the reduced rate RATCHET FAP has a similar complexity to a GSFAP filter with p=5. However, the reduced rate RATCHET FAP can have a normalized step size in the range of $\alpha \in [0,1]$, while GSFAP requires a step size at, or close to, unity. With a stationary input x(n), the reduced rate RATCHET FAP is guaranteed to arrive at the solution to the Toeplitz system in N sampling intervals, because it is recursive. By contrast the GSFAP filter can only complete one complete iteration every $\rho$ sampling intervals, and it may take quite a number of iterations for it to reach the solution. This means that, for a nonstationary input signal x(n), the tracking capability of RATCHET FAP is superior to GSFAP.

While both of the two filtering methods described herein are robust and stable, the $LDL^T$ factorization method can provide an exact solution at an acceptable complexity (the existing stable approaches are all approximate). However, the $LDL^T$ FAP method at the full rate is likely only suitable for cases with small N and where an exact solution is required. Although the RATCHET FAP method is sub-optimal, it is very simple to implement.

Note that although the preceding description is made in the context of echo cancellation, the results are also applicable to other adaptive filtering applications. All data and parameters involved are assumed to be real-valued, as opposed to be more generally complex. This is for simplicity and should not prevent the discussions of the prior art and the invention from being extended to cases involving complex numbers. It is expected that adaptive filters using the $LDL^T$ FAP and RATCHET FAP methods are particularly applicable to telecommunication and other applications of adaptive filtering.

The above-described embodiments of the present invention are intended to be examples only. Alterations, modifications and variations may be effected to the particular embodiments by those of skill in the art without departing from the scope of the invention, which is defined solely by the claims appended hereto.

Appendix A: $LDL^T$ Factorization and System Solving

The goal is to derive the $LDL^T$ factorization algorithm to find $\underline{L}$ and $\underline{D}$ where $$\underline{R} = \underline{LDL}^T \tag{75}$$

i.e., Eq. (15).

In Eq. (75), $\underline{L}$ is a unit lower triangular matrix, with all elements on the main diagonal being unity, i.e., $$\underline{L} = \begin{bmatrix} 1 & & & & & & 0 \\ l_{10} & 1 & & & & & \\ l_{20} & l_{21} & 1 & & & & \\ l_{30} & l_{31} & l_{32} & 1 & & & \\ \vdots & \vdots & \vdots & \vdots & \ddots & & \\ l_{N-2,0} & l_{N-2,1} & l_{N-2,2} & l_{N-2,3} & \cdots & 1 & \\ l_{N-1,0} & l_{N-1,1} & l_{N-1,2} & l_{N-1,3} & \cdots & l_{N-1,N-2} & 1 \end{bmatrix} \tag{76}$$

and $$\underline{D} = \begin{bmatrix} d_0 & & & & 0 \\ & d_1 & & & \\ & & d_2 & & \\ & & & \ddots & \\ 0 & & & & d_{N-1} \end{bmatrix}$$

is a diagonal matrix. Equation (75) can be written as $$\underline{R} = \underline{L}(\underline{DL}^T) \tag{77}$$

An expanded form of Eq. (77) is $$\begin{bmatrix} r_{00} & r_{01} & \cdots & r_{0,N-1} \\ r_{10} & r_{11} & \cdots & r_{1,N-1} \\ \vdots & \vdots & & \vdots \\ r_{N-1,0} & r_{N-1,1} & \cdots & r_{N-1,N-1} \end{bmatrix} = \begin{bmatrix} 1 & & & & & & 0 \\ l_{10} & 1 & & & & & \\ l_{20} & l_{21} & 1 & & & & \\ l_{30} & l_{31} & l_{32} & 1 & & & \\ \vdots & \vdots & \vdots & \vdots & \ddots & & \\ l_{N-2,0} & l_{N-2,1} & l_{N-2,2} & l_{N-2,3} & \cdots & 1 & \\ l_{N-1,0} & l_{N-1,1} & l_{N-1,2} & l_{N-1,3} & \cdots & l_{N-1,N-2} & 1 \end{bmatrix} \cdot \begin{bmatrix} d_0 & l_{10}d_0 & l_{20}d_0 & l_{30}d_0 & \cdots & l_{N-2,0}d_0 & l_{N-1,0}d_0 \\ & d_1 & l_{21}d_1 & l_{31}d_1 & \cdots & l_{N-2,1}d_1 & l_{N-1,1}d_1 \\ & & d_2 & l_{32}d_2 & \cdots & l_{N-2,2}d_2 & l_{N-1,2}d_2 \\ & & & d_3 & \cdots & l_{N-2,3}d_3 & l_{N-1,3}d_3 \\ & & & & \ddots & \vdots & \vdots \\ & & & & & d_{N-2} & l_{N-1,N-2}d_{N-2} \\ 0 & & & & & & d_{N-1} \end{bmatrix} \tag{78}$$

Looking at Eq. (78), we begin by finding $d_0$ and column 0 of $\underline{L}$. Since $$r_{00} = d_0$$

$$r_{k0} = l_k d_0, \quad \forall k \in [1, N-1] \tag{79}$$

$d_0$ and column 0 of $\underline{L}$ are found as $$d_0 = r_{00}$$

$$l_{k0} = r_{k0}/d_0, \quad \forall k \in [1, N-1] \tag{80}$$

Now assuming that, for a certain $i \in (1, N-2)$, $\{d_0, d_1, \ldots, d_{i-1}\}$ and columns 0 through i-1 of $\underline{L}$ have been found, we have $$r_{ii} = \sum_{j=0}^{i-1} l_{ij} v_{ij} + d_i \Rightarrow d_i = r_{ii} - \sum_{j=0}^{i-1} l_{ij} v_{ij} \tag{81}$$

where $$v_{ij} = l_{ij} d_{ij}, \quad 0 \le j \le i-1 \tag{82}$$

Furthermore $$r_{ki} = \sum_{j=0}^{i-1} l_{kj} v_{ij} + l_{ki} d_i \Rightarrow l_{ki} = \frac{1}{d_i}\left(r_{ki} - \sum_{j=0}^{i-1} l_{kj} v_{ij}\right), \quad \forall k \in [i+1, N-1] \tag{83}$$

Thus, starting with the quantities in Eq. (80), recursive use of Eqs. (81) and (83) for i=1, 2, ..., N-2, and use of Eq. (81) for i=N-1 will find all elements of $\underline{D}$ and all columns of $\underline{L}$. The $LDL^T$ factorization studied above can be summarized as $$i = 0, 1, \ldots, N-1: \quad (84)$$

$$d_i = r_{ii}$$

If $i > 0$ $$j = 0, 1, \ldots, i-1:$$

$$v_j = l_{ij} d_j$$

$$d_i = d_i - \sum_{j=0}^{i-1} l_{ij} v_j$$

If $i < N-1$ $$k = i+1, i+2, \ldots, N-1:$$

If $i = 0$ $$l_{k0} = r_{k0}/d_0$$

Else ($i > 0$)

$$l_{ki} = \frac{1}{d_i}\left(r_{ki} - \sum_{j=0}^{i-1} l_{kj} v_j\right)$$

where $\{v_0, v_1, \ldots, v_{N-2}\}$ are temporary storage locations. For computational efficiency, Eq. (84) can be implemented as:

$$i = 0: \quad (85)$$

$$d_0 = r_{00}$$

$$a_0 = 1/d_0$$

$$k = 1, 2, \ldots, N-1:$$

$$l_{k0} = a_0 r_{k0}$$

$$i = 1, 2, \ldots, N-2:$$

$$j = 0, 1, \ldots, i-1:$$

$$v_j = l_{ij} d_j$$

$$d_i = r_{ii} - \sum_{j=0}^{i-1} l_{ij} v_j$$

$$a_i = 1/d_i$$

$$k = i+1, i+2, \ldots, N-1:$$

$$l_{ki} = a_i\left(r_{ki} - \sum_{j=0}^{i-1} l_{kj} v_j\right)$$

$$i = N-1:$$

$$j = 0, 1, \ldots, N-2:$$

$$v_j = l_{N-1,j} d_j$$

$$d_{N-1} = r_{N-1,N-1} - \sum_{j=0}^{N-2} l_{N-1,j} v_j$$

$$a_{N-1} = 1/d_{N-1}$$

Note that $\{a_1, a_2, \ldots, a_{N-1}\}$ are saved for later use in Eq. (90), and the last DIV is performed solely for that purpose. Total numbers of MACs and DIVs for the above $LDL^T$ factorization are $$N_{MAC,F} = (N-1) + 2\sum_{i=1}^{N-2} i + \sum_{i=1}^{N-2}(N-i-1)(i+1) + 2(N-1) \quad (86)$$

$$= \frac{N^3}{6} + N^2 - \frac{7N}{6}$$

and $$N_{DIV,F} = N \quad (87)$$

respectively.

With $\underline{\underline{L}}$ and $\underline{\underline{D}}$ found, Eq (17) on page 14, i.e., $\underline{\underline{L}}\underline{\epsilon}^{(L)}=\underline{e}$, can be solved by Forward Substitution $$i = 0, 1, \ldots, N-2 \quad (88)$$

$$\epsilon_i^{(L)} = e_i$$

$$j = i+1, i+2, \ldots, N-1$$

$$e_j = e_j - l_{ji}\epsilon_i^{(L)}$$

$$\epsilon_{N-1}^{(L)} = e_{N-1}$$

Total number of MACs for the above forward substitution algorithm is $$N_{MAC,FS} = \sum_{i=0}^{N-2}(N-i-1) = \frac{N}{2}(N-1) \quad (89)$$

and there is no DIV operation involved in Eq. (88), i.e., $N_{DIV,FS}=0$. Next, Eq. (18), i.e. $\underline{\underline{D}}\underline{\epsilon}^{(D)}=\underline{\epsilon}^{(L)}$, can be solved by Scaling $$i=0,1,\ldots,N-1$$

$$\epsilon_i^{(D)} = a_i \epsilon_i^{(L)} \quad (90)$$

where $\{a_1, a_2, \ldots, a_{N-1}\}$ are obtained from Eq. (85). Total number of MACs for the above scaling algorithm is $$N_{MAC,S} = N \quad (91)$$

and there is no DIV operation involved in Eq. (90), i.e., $N_{DIV,S}=0$. Finally, Eq. (19), i.e. $\underline{\underline{L}}^T\underline{\epsilon}=\underline{\epsilon}^{(D)}$ is solved by Back Substitution $$i = N-1, N-2, \ldots, 1: \quad (92)$$

$$\epsilon_i = \epsilon_i^{(D)}$$

$$j = i-1, i-2, \ldots, 0:$$

$$\epsilon_j^{(D)} = \epsilon_j^{(D)} - l_{ij}\epsilon_i$$

$$\epsilon_0 = \epsilon_0^{(D)}$$

Total number of MACs for the above back substitution algorithm is $$N_{MAC,BS} = \sum_{i=1}^{N-1} i = \frac{N}{2}(N-1) \qquad (93)$$

and there is no DIV operation involved in Eq. (92), i.e., $N_{DIV,BS}=0$.

To summarize, the $LDL^T$ factorization method to solve Eq. (9) on is expressed in Eqs. (85), (88), (90), and (92). The total numbers of MACs and DIVs needed are $$\begin{aligned} N_{MAC,LDL} &= N_{MAC,F} + N_{MAC,FS} + N_{MAC,S} + N_{MAC,BS} \\ &= \frac{N^3}{6} + N^2 - \frac{7N}{6} + \frac{N}{2}(N-1) + N + \frac{N}{2}(N-1) \\ &= \frac{N^3}{6} + 2N^2 - \frac{7N}{6} \end{aligned} \qquad (94)$$

and $$\begin{aligned} N_{DIV,LDL} &= N_{DIV,F} + N_{DIV,FS} + N_{DIV,S} + N_{DIV,BS} \\ &= N_{DIV,F} + 0 + 0 + 0 \\ &= N \end{aligned} \qquad (95)$$

respectively.

Appendix B: Durbin's Recursion for Yule-Walker Systems

To follow the derivations in this section, a subscript denotes the dimension of a matrix or vector it belongs to, as also explained at the beginning of this document.

The Durbin's method recursively solves an M-th order Yule-Walker system $$\underline{R}_M = \underline{Y}_M = -\underline{R}_M \qquad (96)$$

where $$\underline{R}_M = \begin{bmatrix} r_0 & r_1 & r_2 & \cdots & r_{M-2} & r_{M-1} \\ r_1 & r_0 & r_1 & \cdots & r_{M-3} & r_{M-2} \\ r_2 & r_1 & r_0 & \cdots & r_{M-4} & r_{M-3} \\ \vdots & \vdots & \vdots & & \vdots & \vdots \\ r_{M-2} & r_{M-3} & r_{M-4} & \cdots & r_0 & r_1 \\ r_{M-1} & r_{M-2} & r_{M-3} & \cdots & r_1 & r_0 \end{bmatrix} \qquad (97)$$

is and M-th order symmetric Toeplitz matrix, and $$\underline{Y}_M \equiv \begin{bmatrix} y_0 \\ y_1 \\ \vdots \\ y_{M-1} \end{bmatrix} \text{ and } \underline{R}_M \equiv \begin{bmatrix} r_1 \\ r_2 \\ \vdots \\ r_M \end{bmatrix} \qquad (98)$$

are M-dimensional solution and given vectors, respectively. Note that, with suffixing, $\underline{R}_M$ is a one-position up-shifted version of the left-most column of $\underline{R}_M$. Supposing that the k-th ($1 \leq k \leq M-1$) order Yule-Walker system $$\underline{R}_k \underline{Y}_k^{(k)} = -\underline{R}_k \qquad (99)$$

where $$\underline{Y}_k^{(k)} \equiv \begin{bmatrix} y_0^{(k)} \\ y_1^{(k)} \\ \vdots \\ y_{k-1}^{(k)} \end{bmatrix} \qquad (100)$$

has been solved, we try to solve the (k+1)-th order system $$\underline{R}_{k+1} \underline{Y}_{k+1}^{(k+1)} = -\underline{R}_{k+1} \qquad (101)$$

which can be expressed as $$\begin{bmatrix} \underline{R}_k & \underline{E}_k \underline{R}_k \\ \underline{R}_k^T \underline{E}_k & r_0 \end{bmatrix} \begin{bmatrix} \underline{Y}_k^{(k+1)} \\ y_k^{(k+1)} \end{bmatrix} = -\begin{bmatrix} \underline{R}_k \\ r_{k+1} \end{bmatrix} \qquad (102)$$

where $\underline{E}_k$ is a k-th order exchange matrix, and $$\underline{Y}_k^{(k+1)} = \begin{bmatrix} y_0^{(k+1)} \\ y_1^{(k+1)} \\ \vdots \\ y_{k-1}^{(k+1)} \end{bmatrix} \qquad (103)$$

Taking into account Eq. (99), we can expand Eq. (102) into $$\underline{R}_k \underline{Y}_k^{(k+1)} y_k^{(k+1)} \underline{E}_k \underline{R}_k = -\underline{R}_k = \underline{R}_k \underline{Y}_k^{(k)} \qquad (104)$$

and $$\underline{R}_k^T \underline{E}_k \underline{Y}_k^{(k+1)} + r_0 y_k^{(k+1)} = -r_{k+1} \qquad (105)$$

From Eq. (104), considering that $\underline{R}_k^{-1}$ is persymmetric, (therefore $\underline{EA}=\underline{AE}$) and using Eq. (99), one can derive $$\begin{aligned} \underline{Y}_k^{(k+1)} &= \underline{Y}_k^{(k)} - y_k^{(k+1)} \underline{R}_k^{-1} \underline{E}_k \underline{R}_k = \underline{Y}_k^{(k)} - y_k^{(k+1)} \underline{E}_k \underline{R}_k^{-1} \underline{R}_k \\ &= \underline{Y}_k^{(k)} + y_k^{(k+1)} \underline{E}_k \underline{Y}_k^{(k)} \end{aligned} \qquad (106)$$

Using Eqs. (106) and the fact that a k-th order exchange matrix $\underline{E}_k$ is a mirror image of the k-th order identity matrix $\underline{I}_k$ and thus $$\underline{E}_k = \underline{E}_k^T, \underline{E}_k \underline{E}_k = \underline{I}_k \qquad (107)$$

Eq. (104) can be turned into $$\begin{aligned} r_0 y_k^{(k+1)} &= -r_{k+1} - R_k^T \underline{E}_k \underline{Y}_k^{(k+1)} = -r_{k+1} - R_k^T \underline{E}_k [\underline{Y}_k^{(k)} + y_k^{(k+1)} \underline{E}_k \underline{Y}_k^{(k)}] \\ &= -r_{k+1} - R_k^T \underline{E}_k \underline{Y}_k^{(k+1)} - y_k^{(k+1)} R_k^T \underline{Y}_k^{(k)} \end{aligned} \qquad (108)$$

or $$y_k^{(k+1)} = -\frac{r_{k+1} + R_k^T \underline{E}_k Y_k^{(k)}}{r_0 + R_k^T Y_k^{(k)}} \quad (109)$$

Equations (106) and (109) form the solution to the (k+1)-th order Yule-Walker system Eq. (101).

To simplify the computation, we define $$\rho_k \equiv \frac{1}{r_0 + R_k^T Y_k^{(k)}} \quad (110)$$

Using Eqs. (106) and (109), (110) can be turned into $$\frac{1}{\rho_k} = r_0 + R_k^T Y_k^{(k)} = r_0 + [R_{k-1}^T \; r_k] \begin{bmatrix} Y_{k-1}^{(k-1)} + y_{k-1}^{(k)} \underline{E}_{k-1} Y_{k-1}^{(k-1)} \\ y_{k-1}^{(k)} \end{bmatrix} \quad (111)$$

$$= r_0 + R_{k-1}^T Y_{k-1}^{(k-1)} + y_{k-1}^{(k)} R_{k-1}^T \underline{E}_{k-1} Y_{k-1}^{(k-1)} + r_k y_{k-1}^{(k)}$$

$$= \frac{1}{\rho_{k-1}} + y_{k-1}^{(k)} [r_k + R_{k-1}^T \underline{E}_{k-1} Y_{k-1}^{(k-1)}]$$

$$= \frac{1}{\rho_{k-1}} - [r_0 + R_{k-1}^T Y_{k-1}^{(k-1)}][y_{k-1}^{(k)}]^2$$

$$= \frac{1}{\rho_{k-1}} \{1 - [y_{k-1}^{(k)}]^2\}$$

or $$\rho_k = \frac{\rho_{k-1}}{1 - [y_{k-1}^{(k)}]^2} \quad (112)$$

Combining Eqs. (106), (109), and (112), we can summarize the Durbin's recursive algorithm to solve Eq. (96) as the following $$\rho = \frac{1}{r_0}; \; y_0^{(l)} = -\rho_0 r_1 \quad (113)$$

$$k = 1, 2, \ldots, M-1:$$

$$\rho_k = \frac{\rho_{k-1}}{1 - [y_{k-1}^{(k)}]^2}$$

$$y_k^{(k+1)} = -\rho_k [r_{k+1} + R_k^T \underline{E}_k Y_k^{(k)}]$$

$$Y_k^{(k+1)} = Y_k^{(k)} + y_k^{(k+1)} \underline{E}_k Y_k^{(k)}$$

$$\underline{Y}_M = \begin{bmatrix} Y_{M-1}^{(M)} \\ y_{M-1}^{(M)} \end{bmatrix}$$

An implementation of Eq. (113) is $$\rho = \frac{1}{r_0}; \; y_0 = -\rho r_1 \quad (114)$$

$$k = 1, 2, \ldots, M-1:$$

$$\rho = \frac{\rho}{1 - y_{k-1}^2}$$

$$y_k = -\rho \left( r_{k+1} + \sum_{j=1}^{k} r_j y_{k-j} \right)$$

$$j = 0, 1, \ldots, k-1:$$

$$z_j = y_j + y_k y_{k-1-j}$$

$$j = 0, 1, \ldots, k-1:$$

$$y_j = z_j$$

where $\{z_0, z_1, \ldots, z_{M-2}\}$ are temporary storage elements.

Based on Eq. (114), the total numbers of MACs and DIVs needed for recursively solving an M-th order Yule-Walker system are $$N_{MAC,YW} = 1 + \sum_{k=1}^{M-1} (k + k + 1 + 1) = M^2 + M - 1 \quad (115)$$

and $$N_{DIV,YW} = M \quad (116)$$

respectively.

With a system of the order M=N−1, these figures become $$N_{MAC,YW} = (N-1)^2 + (N-1) - 1 = N^2 - N - 1 \quad (117)$$

and $$N_{DIV,YW} = N - 1 \quad (118)$$

respectively.

What is claimed is:

1. A method of adaptive filtering using a fast affine projection adaptive filter, comprising steps of:
   (a) initializing adaptive filter coefficients of the filter;
   (b) updating the adaptive filter coefficients by:
      (i) setting a normalized step size;
      (ii) determining autocorrelation matrix coefficients of an autocorrelation matrix $\underline{R}_N$ from a reference input signal;
      (iii) directly determining a projected error vector $\underline{\epsilon}_N(n+1)$ by solving an N-th order positive-definite system of linear equations $\underline{R}_N \underline{\epsilon}(n+1) = \underline{e}_N(n+1)$ using a backward recursion, followed by a forward recursion, on a known projected error vector $\underline{\epsilon}_N(n)$, where $\underline{e}_N(n+1)$ is a prefixed, one position down shifted version of a current output signal vector $\underline{e}_N(n)$ scaled in accordance with the normalized step size;
      (iv) updating the adaptive filter coefficients in accordance with coefficients of the projected error vector; and
   (c) repeating step (b) until convergence of the adaptive filter coefficients is achieved.

2. The method of claim 1, wherein solving the N-th order positive-definite system of linear equations includes solving an (N−1)-th order Yule-Walker system.

3. The method of claim 2, wherein solving the Yule-Walker system is repeated at a reduced rate.

4. The method of claim 3, wherein the Yule-Walker system is solved once in every N sampling intervals.

5. A method of claim 1, wherein determining the autocorrelation matrix coefficients is performed recursively.

6. The method of claim 1, wherein the normalized step size is greater than or equal to 0 and less than or equal to 1.

7. The method of claim 1, wherein when the normalized step size is substantially equal to 1, the backward and forward recursion steps can be eliminated.

8. The method of claim 1, wherein the steps are performed with complex valued numbers.

9. The method of claim 1, the method being used for echo cancellation.

10. The method of claim 1, the method being used for noise cancellation.

11. The method of claim 1, the method being used for channel equalization.

12. A method of adaptive filtering using a fast affine projection adaptive filter, comprising steps of:
  (a) initializing adaptive filter coefficients of the filter;
  (b) updating the adaptive filter coefficients by:
    (i) determining autocorrelation matrix coefficients of an autocorrelation matrix $\underline{\underline{R}}_N$ from a reference input signal;
    (ii) directly determining a projected error vector $\underline{\epsilon}_N(n)$ by solving an N-th order positive-definite system of linear equations $\underline{\underline{R}}_N \underline{\epsilon}(n) = \underline{e}_N(n)$ using an $LDL^T$ factorization of the autocorrelation matrix and solving the system of linear equations by forward substitution, scaling and back substitution;
    (iii) updating the adaptive filter coefficients in accordance with the projected error vector; and
  (c) repeating step (b) until convergence of the adaptive filter coefficients is achieved.

13. The method of claim 12, wherein the $LDL^T$ factorization is repeated at a reduced rate.

14. The method of claim 13, wherein the $LDL^T$ factorization is repeated once in every N sampling intervals.

15. A method of claim 12, wherein determining the autocorrelation matrix coefficients is performed recursively.

16. The method of claim 12, wherein the normalized step size is greater than or equal to 0 and less than or equal to 1.

17. The method of claim 12, wherein the steps are performed with complex value numbers.

18. The method of claim 12, the method being used for echo cancellation.

19. The method of claim 12, the method being used for noise cancellation.

20. The method of claim 12, the method being used for channel equalization.

* * * * *